United States Patent
Shinoda et al.

(10) Patent No.: US 11,217,454 B2
(45) Date of Patent: Jan. 4, 2022

(54) PLASMA PROCESSING METHOD AND ETCHING APPARATUS

(71) Applicant: HITACHI HIGH-TECH CORPORATION, Tokyo (JP)

(72) Inventors: Kazunori Shinoda, Tokyo (JP); Hiroto Otake, Tokyo (JP); Hiroyuki Kobayashi, Tokyo (JP); Kohei Kawamura, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 1 day.

(21) Appl. No.: 16/646,057

(22) PCT Filed: Apr. 22, 2019

(86) PCT No.: PCT/JP2019/016930
§ 371 (c)(1),
(2) Date: Mar. 10, 2020

(87) PCT Pub. No.: WO2020/217266
PCT Pub. Date: Oct. 29, 2020

(65) Prior Publication Data
US 2021/0242030 A1    Aug. 5, 2021

(51) Int. Cl.
*H01L 21/311* (2006.01)
*H01J 37/18* (2006.01)
(Continued)

(52) U.S. Cl.
CPC ........ *H01L 21/31116* (2013.01); *H01J 37/18* (2013.01); *H01J 37/32449* (2013.01);
(Continued)

(58) Field of Classification Search
CPC ........... H01L 21/31116; H01L 21/3065; H01L 21/0212; H01J 37/18; H01J 37/32449
See application file for complete search history.

(56) References Cited

U.S. PATENT DOCUMENTS 5,195,045 A   3/1993  Keane et al.
5,712,592 A   1/1998  Stimson et al.
(Continued)

FOREIGN PATENT DOCUMENTS

JP    H06045326 A    2/1994
JP    H07254606 A    10/1995
(Continued)

OTHER PUBLICATIONS

Patrick Verdonck, et al., "Analysis of the Etching Mechanisms of Tungsten in Fluorine Containing Plasmas", Journal of Electrochemical Society, vol. 142, No. 6, pp. 1971-1976 (1995).
(Continued)

*Primary Examiner* — Binh X Tran
(74) *Attorney, Agent, or Firm* — Miles & Stockbridge, P.C.

(57) ABSTRACT

The present invention provides a plasma processing method or a plasma processing method, which allows the evenness of etching amounts to increase and the yield of processing to improve.
A method for etching a tungsten film includes: a first step of depositing a fluorocarbon layer and forming an intermediate layer that contains tungsten and fluorine and is self-limiting between the fluorocarbon layer and the tungsten film by supplying plasma of an organic gas containing fluorine to a base material having the tungsten film over at least a part of the surface; and a second step of removing the fluorocarbon layer and the intermediate layer by using plasma of an oxygen gas.

4 Claims, 10 Drawing Sheets

(51) Int. Cl.
  *H01J 37/32* (2006.01)
  *H01L 21/02* (2006.01)
  *H01L 21/3065* (2006.01)

(52) U.S. Cl.
  CPC ...... *H01L 21/0212* (2013.01); *H01L 21/3065* (2013.01); *H01J 2237/3344* (2013.01)

(56) References Cited

U.S. PATENT DOCUMENTS

| | | |
|---|---|---|
| 5,770,922 A | 6/1998 | Gerrish et al. |
| 6,265,831 B1 | 7/2001 | Howald et al. |
| 6,270,618 B1 | 8/2001 | Nakano et al. |
| 6,351,683 B1 | 2/2002 | Johnson et al. |
| RE38,273 E | 10/2003 | Gerrish et al. |
| 6,677,711 B2 | 1/2004 | MacGearailt |
| 6,919,689 B2 | 7/2005 | Jafarian-Tehrani et al. |
| 7,084,832 B2 | 8/2006 | Pribyl |
| 7,190,119 B2 | 3/2007 | Patrick et al. |
| 7,645,357 B2 | 1/2010 | Paterson et al. |
| 8,038,896 B2 | 10/2011 | Ikegami et al. |
| 8,546,266 B2 | 10/2013 | Mori et al. |
| 9,431,268 B2 | 8/2016 | Lill et al. |
| 9,548,228 B2 | 1/2017 | Chandrashekar et al. |
| 9,978,610 B2 | 5/2018 | Fung et al. |
| 2001/0022293 A1 | 9/2001 | Maeda et al. |
| 2002/0123229 A1 | 9/2002 | Ono et al. |
| 2004/0185670 A1 | 9/2004 | Hamelin et al. |
| 2006/0037704 A1 | 2/2006 | Iwata et al. |
| 2006/0048892 A1 | 3/2006 | Arase et al. |
| 2007/0044716 A1 | 3/2007 | Tetsuka et al. |
| 2008/0128087 A1 | 6/2008 | Hayano et al. |
| 2008/0190893 A1 | 8/2008 | Mori et al. |
| 2008/0268645 A1 | 10/2008 | Kao et al. |
| 2008/0277062 A1 | 11/2008 | Koshimizu et al. |
| 2009/0023296 A1 | 1/2009 | Nishizuka |
| 2010/0258529 A1 | 10/2010 | Mori et al. |
| 2011/0297533 A1 | 12/2011 | Mori et al. |
| 2013/0228550 A1 | 9/2013 | Mori et al. |
| 2014/0102640 A1 | 4/2014 | Yokogawa et al. |
| 2014/0225503 A1 | 8/2014 | Mori et al. |
| 2015/0072533 A1 | 3/2015 | Muraki et al. |
| 2015/0179464 A1 | 6/2015 | Wang et al. |
| 2015/0262829 A1 | 9/2015 | Park et al. |
| 2015/0270148 A1 | 9/2015 | Shinoda et al. |
| 2015/0357210 A1 | 12/2015 | Mori et al. |
| 2016/0035585 A1 | 2/2016 | Xiang et al. |
| 2017/0053810 A1 | 2/2017 | Yang et al. |
| 2017/0194166 A1 | 7/2017 | Tan et al. |
| 2018/0211824 A1* | 7/2018 | Kudo ................ H01L 21/68785 |
| 2019/0067032 A1* | 2/2019 | Shinoda ................ H01J 37/00 |

FOREIGN PATENT DOCUMENTS

| | | |
|---|---|---|
| JP | H11185998 A | 7/1999 |
| JP | 2000091321 A | 3/2000 |
| JP | 2001185542 A | 7/2001 |
| JP | 2002343768 A | 11/2002 |
| JP | 2003347278 A | 12/2003 |
| JP | 2005259839 A | 9/2005 |
| JP | 2006066905 A | 3/2006 |
| JP | 2007059567 A | 3/2007 |
| JP | 2008244146 A | 10/2008 |
| JP | 2011082180 A | 4/2011 |
| JP | 2016139792 A | 8/2016 |
| JP | 2017063186 A | 3/2017 |
| JP | 2019040932 A | 3/2019 |
| TW | 200620454 A | 6/2006 |
| TW | 200802592 A | 1/2008 |
| TW | 200829087 A | 7/2008 |
| TW | 201533796 A | 9/2015 |

OTHER PUBLICATIONS

International Search Report dated Jul. 16, 2019 issued in PCT/JP2019/016930.
Office Action dated Sep. 26, 2018 for TW Application No. 107106284.
Office Action dated Jul. 13, 2018 for KR Application No. 10-2014-0013325 (with Machine translation).
Office Action dated Jul. 13, 2018 for KR Application No. 10-2015-0053111 (with Machine translation).
Office Action dated Aug. 9, 2016 for JP Application No. 2013-112562.
Office Action dated Jan. 15, 2016 for TW Application No. 10520049730.
Office Action dated Jan. 19, 2015 for KR Application No. 10-2014-0013325 (partial translation).
STIC Search Report dated Oct. 7, 2014 for U.S. Appl. No. 14/177,251.
Office Action dated Apr. 20, 2021 in Japanese Application No. 2020-509124.

* cited by examiner

PLASMA PROCESSING METHOD AND ETCHING APPARATUS

TECHNICAL FIELD

The present invention relates to an etching method and an etching apparatus of a tungsten film using plasma.

BACKGROUND ART

High integration of semiconductor devices is advancing by being driven by the proliferation of mobile devices represented by smartphones. In the field of recording semiconductors, a three-dimensional (3D) NAND flash memory in which memory cells are stacked in multiple stages in three-dimensional directions is mass-produced and the number of memory stacked layers is 96 currently. Further, in the field of logic semiconductor devices, a fin-type FET (Field Effect Transistor) having a three-dimensional structure as the structure of the circuit is the mainstream.

As the three-dimensionalization of an element structure and the fractionalization of processing dimensions advance in this way, an etching technology having both isotropy and a high processing dimensional controllability of an atomic layer level is increasingly required in a device manufacturing process. As such isotropic etching technologies, wet etching technologies including etching of silicon dioxide using a mixed aqueous solution of hydrofluoric acid and ammonium fluoride, etching of silicon nitride using hot phosphoric acid, etching of tungsten using a mixed liquid of hydrofluoric acid and nitric acid, and the like have heretofore been widely used. A problem of conventional wet etching technologies using such chemical solutions however has been that pattern collapse caused by the surface tension of a rinse solution becomes obvious in accordance with the fractionalization of a pattern.

For example, it is reported that, when a high aspect-ratio pattern of silicon is used, a limit value of a pattern interval where collapse starts by a surface tension during the drying of a rinse solution increases in proportion to the square of an aspect ratio while the pattern interval reduces. Development of a processing method for isotropically etching various films without using a chemical solution therefore has been strongly desired.

Meanwhile, tungsten is used widely as a material of an electrode or a wire used in a circuit of such a semiconductor device as stated above. In a process of manufacturing a next-generation semiconductor device therefore, an etching technology of tungsten having isotropy, a high processing dimensional controllability of an atomic layer level, and a high selectivity has been desired.

As conventional technologies of isotropically etching a tungsten film by not using a chemical solution but using plasma, technologies described in Japanese Unexamined Patent Application Publication No. 2005-259839 (Patent Literature 1) and Japanese Unexamined Patent Application Publication No. Hei 7-254606 (Patent Literature 2) are known.

Patent Literature 1 discloses a method of forming a W film using a conductive material containing tungsten, successively forming a Zr film comprising a material containing zirconium over the W film, forming plasma by using a gas containing fluorine ($SF_6$) and a gas containing chlorine, and etching the W film by reactive ion etching with the Zr film used as a mask. Further, Patent Literature 2 discloses a technology of etching a tungsten film by using plasma formed by supplying a gas containing halogen such as fluorine and oxygen ($O_2$) in a structure formed by stacking a polycrystalline silicon film and the tungsten film.

Moreover, a method of isotropically etching tungsten at an etching speed of exceeding 160 nm/min by using plasma of $NF_3/O_2$ and supplying fluorine radicals is disclosed in Nonpatent Literature 1.

CITATION LIST

Patent Literature

Patent Literature 1: Japanese Unexamined Patent Application Publication No. 2005-259839
Patent Literature 2: Japanese Unexamined Patent Application Publication No. Hei 7-254606 Nonpatent Literature
Nonpatent Literature 1: Patrick Verdonck, Jacobus Swart, Guy Brasseur, and Pasca L De Geyter, Journal of Electrochemical Society, vol. 142, No. 6, 1971 (1995)

SUMMARY OF INVENTION

Technical Problem

The above conventional technologies had problems because the following points were not fully considered.

That is, in the above conventional technologies, although a technology of applying etching in a structure of arranging a film layer as a mask (film structure) above a film containing tungsten is disclosed, processing conditions for etching film layers containing tungsten in a lateral direction in a so-called three-dimensional structure in which the film layers containing tungsten and masks or insulating films are stacked alternately in multiple layers such as an FET have not been taken into consideration. No consideration has been given to the fact that, when film layers containing tungsten arranged vertically with insulating films interposed in between are etched in a lateral direction (horizontal direction) in particular, the etching speeds are different between the upper and lower film layers containing tungsten and, as a result of the processing, variations in the dimensions of the processed film layers may undesirably occur in the vertical direction. A problem of the conventional technologies therefore has been that a large distribution may undesirably occur in the etching amount of the film layers to be processed in the vertical (depth) direction of the pattern formed in a film structure and the yield of device processing is hindered.

Further, in the conventional technologies, the etching of a tungsten film advances continuously at an etching speed exceeding 160 nm/min for example. In such high-speed etching treatment, the amount of etching is adjusted by detecting and adjusting the time elapsing after the start of the etching treatment. In such adjustment of an etching amount by the time of processing, a very fine amount of etching, for example etching of an atomic layer level in the depth (width) of the etching, can hardly be adjusted with a high degree of accuracy and hence it has been concerned that the accuracy and yield of the processing may be impaired.

As stated above, in the conventional continuous plasma etching technologies, the amount of etching becomes uneven reflecting the distribution of radicals, the evenness of etching amounts in directions on a wafer plane and a pattern depth direction is poor, and the etching amount has to be controlled by the plasma processing time. The application of the conventional continuous plasma etching technologies therefore is thought to be restricted in a device manufacturing process of the next generation and later requiring a high dimensional controllability of an atomic layer level.

An object of the present invention is to provide a plasma processing method or a plasma processing method, which allows the evenness of etching amounts to increase and the yield of processing to improve. The above object and novel features of the present invention will be obvious from the descriptions in the present description and attached drawings.

Solution to Problem

In order to attain the above object, the configurations and processing procedures described in the claims are employed for example.

The present application includes a plurality of means for solving the above problems and for example is a plasma processing method for etching a tungsten film, the method being characterized by including: a first processing step of arranging a wafer to be processed in a processing chamber, supplying plasma of an organic gas containing fluorine into the processing chamber, depositing a fluorocarbon layer over the upper surface of a film layer to be processed that is formed over the upper surface of the wafer beforehand and contains tungsten, and forming an intermediate layer that contains tungsten and fluorine in the film layer to be processed and is self-limiting between the fluorocarbon layer and the film layer to be processed; and a second processing step of supplying particles in plasma formed in the processing chamber by using a gas containing oxygen to the upper surface of the film layer to be processed and removing the fluorocarbon layer and the intermediate layer.

Advantageous Effects of Invention

The typical effects obtained by the present invention disclosed in the present application are briefly explained as follows. The present invention makes it possible to provide an isotropic atomic layer etching technology allowing a tungsten film to be etching-processed with a high degree of evenness in directions on a wafer plane and a pattern depth direction and a high processing dimensional controllability of an atomic layer level.

DESCRIPTION OF EMBODIMENTS

In the processing of forming a gate electrode in a process of manufacturing a semiconductor device, for example a next-generation 3D-NAND flash memory, a technology of etching a tungsten film isotropically with a high degree of accuracy of an atomic layer level is thought to be required in a process of etching and electrically separating tungsten embedded into the interior of a high aspect-ratio groove of a fine width in a lateral direction (horizontal direction against a vertical direction in the depth of the groove). The present inventors therefore have examined a case of etching the structure shown in FIG. 9 with plasma by a conventional technology as an example.

Figure 9:
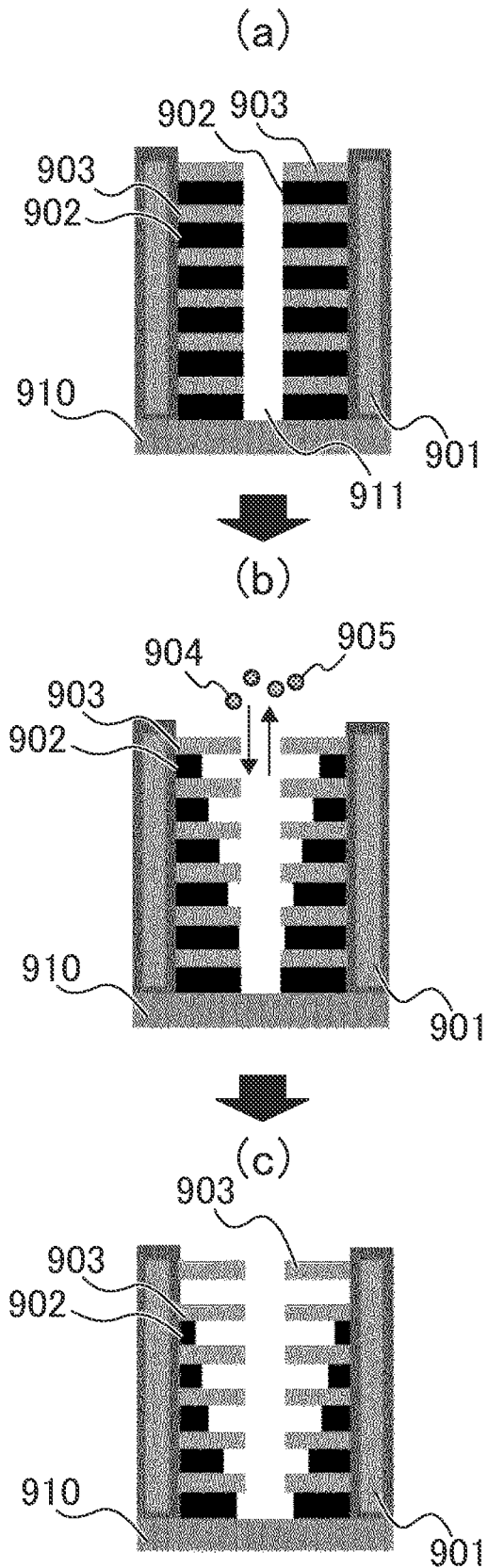
FIG. 9 is a longitudinal sectional view schematically showing, when plasma etching of a conventional technology is applied to a predetermined film structure in which a plurality of film layers formed over a sample over a substrate of a semiconductor wafer to be processed or the like are stacked adjacently one above the other, change in the film structure.

FIG. 9 is a longitudinal sectional view schematically showing, when plasma etching of a conventional technology is applied to a predetermined film structure in which a plurality of film layers formed over a sample over a substrate of a semiconductor wafer to be processed or the like are stacked adjacently one above the other, change in the film structure. (a) to (c) in the figure show three stages of a film structure shape changing with processing applied.

FIG. 9(a) is a view showing a film structure in which a groove 911 of a high aspect ratio is formed between laminated films formed by stacking tungsten films 902 to be processed and silicon dioxide films 903 as insulating films alternately in the vertical direction in the manner of being in contact with each other along both the sidewalls on both the sides of a groove interior formed in a polycrystalline silicon film 901 above a base film 910, the film structure being in the state where etching treatment using plasma does not start. FIG. 9(b) is a view showing a state where etching of the tungsten films 902 has advanced by forming plasma with a gas containing fluorine in order to etch the tungsten films 902 in the film structure of FIG. 9(a), supplying a reactive species 904 containing fluorine in the plasma into the groove 911 in the film structure, making the reactive species 904 react with the surfaces of the tungsten films 902, and removing a generated reaction product 905 containing tungsten upward. FIG. 9(c) is a view showing a state where the etching of the tungsten films 902 with plasma stops. Here, in the present example, the polycrystalline silicon film 901 is formed beforehand over the base film 910 comprising silicon dioxide and the surface is covered with a silicon dioxide film.

In the study by the present inventors, it has been confirmed that, when only tungsten films 902 are etched in the lateral direction in the inside of a high aspect-ratio groove 911 the sidewalls of which on both the sides are configured by a laminated film formed by stacking the tungsten films 902 and silicon dioxide films 903 alternately as shown in FIG. 9(*b*), gas chemistry having a deposition property such as an organic gas is not used, hence a nonvolatile deposition film is not generated over the surfaces of the tungsten films 902, and etching advances continuously by continuous detachment of a reaction product 905 having volatility. Meanwhile, the reactive species 904 supplied from plasma formed above a sample intrudes into the inside of the grove 911 from above and is consumed by the tungsten films 902 constituting the laminated film near an opening at the tip of the groove 911 and the amount of the reactive species 904 reaching the tungsten films 902 in the region of the lower part of the groove 911 reduces. The distribution of etching amounts therefore becomes uneven in the vertical direction of the groove 911 or the laminated film undesirably and eventually the etching amount is large near the opening at the upper part and small at the lower part. As a result, by the etching of the laminated film of the tungsten films 902 and the silicon dioxide films 903 by a conventional technology, it has been concerned that an uneven distribution of etching amounts in the depth direction of the groove or a hole formed in the laminated film is generated undesirably and a yield in the processing of the sample or in the manufacturing of a semiconductor device lowers.

Further, isotropic etching of a tungsten film by a conventional technology advances continuously at a large etching speed exceeding 160 nm/min for example. From this, if it is assumed that an etching amount is adjusted on the basis of time elapsing from the start of processing, it is substantially difficult to control start and stop of etching by plasma to the extent of materializing an etching amount of an atomic layer level.

In this way, by a conventional etching technology using plasma, etching amounts are uneven by reflecting the distribution of radicals, the evenness of the etching amounts in directions on a wafer plane and a pattern depth direction is poor, and an etching amount has to be controlled by plasma processing time. The application of the conventional continuous plasma etching technology therefore seems to be restricted in a device manufacturing process of the next generation which requires a high dimensional controllability of an atomic layer level.

The present inventors have tried to etch a tungsten film by using plasma of various gases. As a result, the present inventors have found that: (1) when a fluorocarbon layer is formed over the surface of a tungsten film by supplying plasma of an organic gas containing fluorine to the tungsten film, a hybrid intermediate layer of fluorine, tungsten, carbon, etc. is formed over the surface of the tungsten film; (2) the amount of the generated intermediate layer is self-limiting; (3) the thickness of the intermediate layer can be adjusted by temperature control; and (4) the fluorocarbon layer and the intermediate layer are removed by plasma containing oxygen. The present invention is created on the basis of the new findings. Specifically, a process of forming a fluorocarbon layer and an intermediate layer over the surface of a tungsten film to be etched by forming plasma of an organic gas containing fluorine and supplying reactive particles from the plasma to the surface of the tungsten film and a succeeding process of removing the fluorocarbon layer and the intermediate layer by plasma using a gas containing oxygen are implemented and a desired amount of tungsten film is etched by combining the processes as a cycle and repeating the cycles multiple times.

Since the process of forming the intermediate layer and the removal process are self-limiting by the above configuration, unevenness of etching amounts in directions on a wafer plane and a pattern depth direction of a film structure such as a groove or a hole is inhibited. Further, the thickness of the film of tungsten removed by one cycle can be adjusted with a high degree of accuracy, the amount of etching obtained by repeating the cycles can be adjusted by the number of repeated cycles, and hence the accuracy of dimensions of a circuit formed by etching stacked tungsten films in the horizontal direction can be improved.

Meanwhile, in the following embodiments, etching treatment of repeating a combined process including the formation process and removal process of a reactive layer, each process being self-limiting, is referred to as atomic layer etching. In the present embodiment, the "atomic layer" etching is not limited to atomic layer etching in the narrow sense that an etching amount per one cycle is equivalent to the thickness of a layer comprising a single atom of a material constituting a target film. Even though an etching amount per one cycle is in the order of nanometer or more for example, processing in which each process tends to be self-saturable, in other words self-limiting, to processing time or the like is also referred to as atomic layer etching. Here, names such as "digital etching", "self-limiting cycle etching", "atomic level etching", and "layer-by-layer etching" can be used for equivalent processing.

Embodiments according to the present invention are explained hereunder in reference to drawings.

First Embodiment

An embodiment according to the present invention is explained hereunder in reference to FIGS. 1 to 5. In the present embodiment, a case of isotropically applying atomic layer etching to a tungsten film to be processed which is formed beforehand over a semiconductor wafer such as a silicon by implementing a process of forming a fluorocarbon layer and an intermediate layer over the surface of the tungsten film to be processed by plasma formed by using a $CHF_3$ gas and successively implementing a process of removing the fluorocarbon layer and the intermediate layer by plasma using an $O_2$ gas is explained.

Further, in the present embodiment, a temperature of a wafer is adjusted so as to be constant or so as to be an approximate value to the extent of being able to be regarded as constant during both the processes of forming and removing the fluorocarbon layer and the intermediate layer and a configuration of heating the wafer or the fluorocarbon layer and the intermediate layer in order to promote or realize the progress of the processes is not particularly prepared. A time per one cycle of the processing therefore can be shortened and a throughput in the processing of a wafer can be increased.

Figure 1:
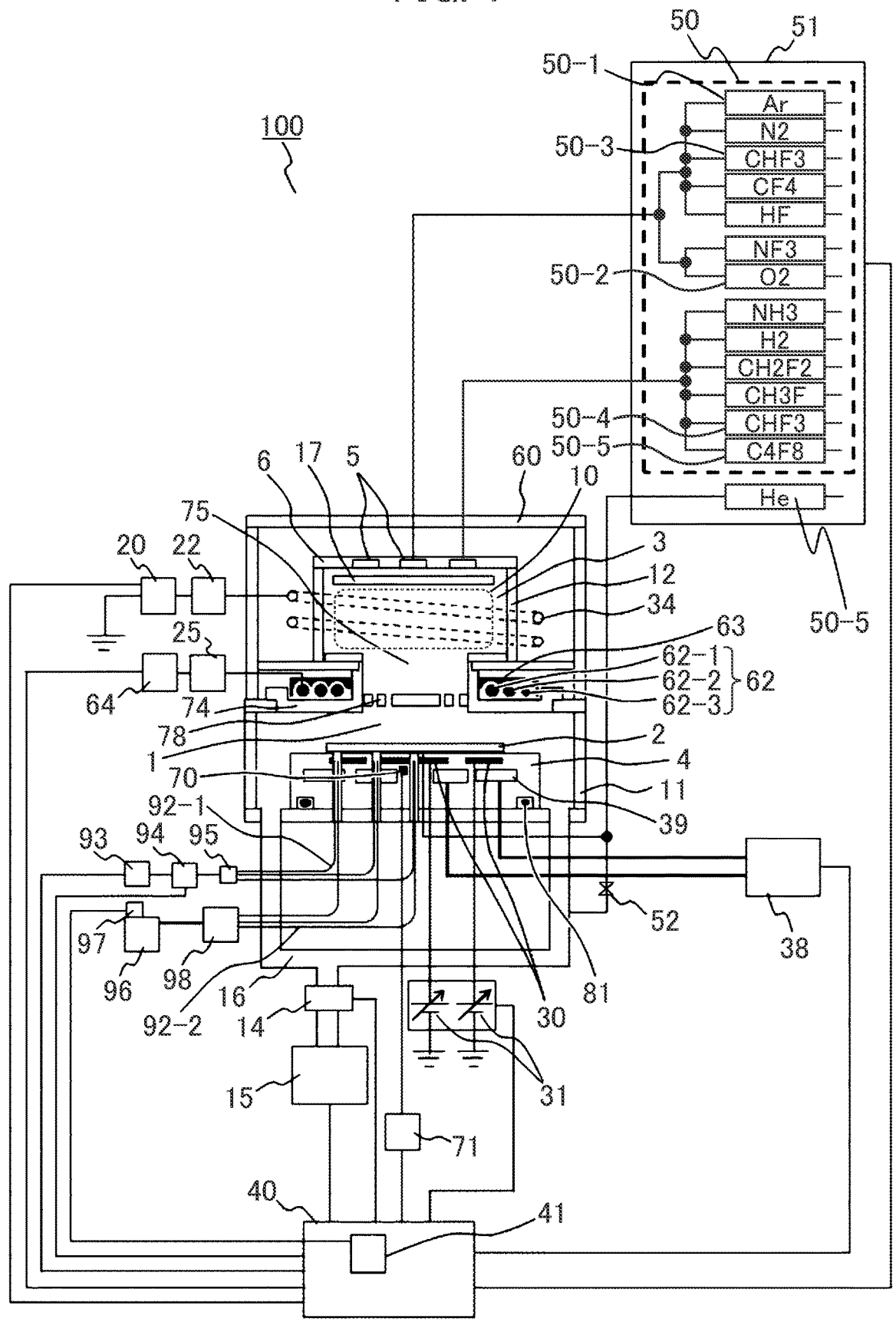
FIG. 1 is a longitudinal sectional view schematically showing the outline of the configuration of a plasma processing apparatus according to an embodiment of the present invention.

FIG. 1 is a longitudinal sectional view schematically showing the outline of the configuration of a plasma processing apparatus according to an embodiment of the present invention.

A processing chamber 1 comprises a base chamber 11 and a wafer stage 4 (hereunder written as stage 4) for placing a wafer 2 (hereunder written as wafer 2) that is a sample to be processed is installed in it. An ICP (Inductively Coupled Plasma) discharge method is used for a plasma source and the plasma source having a quartz chamber 12, an ICP coil 34, and a radio frequency power source 20 is installed above the processing chamber 1. Here, the ICP coil 34 is installed outside the quartz chamber 12.

The radio frequency power source 20 for generating plasma is connected to the ICP coil 34 with a matching device 22 interposed in between. As the frequency of the radio frequency power, a frequency in a frequency band of several tens of MHz, such as 13.56 MHz, is used. A top board 6 is installed at the upper part of the quartz chamber 12. Shower plates 5 are installed in the top board 6 and a gas dispersion plate 17 is installed below them. A processing gas is introduced into the processing chamber 1 from the outer circumference of the gas dispersion plate 17.

The flow rates of supplied processing gases are adjusted by mass flow controllers 50 arranged in a mass flow control unit 51 and installed for respective gas types. In FIG. 1, at least Ar, $O_2$, $CHF_3$, and $C_4F_8$ are supplied to the processing chamber 1 as processing gases and mass flow controllers 50-1, 50-2, 50-3, 50-4, and 50-5 are installed in response to the respective gas types. Here, the supplied gases are not limited to those gases. Here, in the mass flow control unit 51, a mass flow controller 50-6 to adjust the flow rate of a He gas supplied between the rear surface of the wafer 2 and the upper surface of a dielectric film of the stage 4 over which the wafer 2 is placed as it will be described later is also arranged.

The lower part of the processing chamber 1 is connected to an exhaust means 15 through a vacuum exhaust pipe 16 in order to depressurize the processing chamber. The exhaust means 15 comprises a turbo molecular pump, a mechanical booster pump, or a dry pump for example. Further, a pressure regulating means 14 comprising a plurality of tabular flaps that are arranged so as to have axes in a transverse direction in a flow channel and rotate around the axes or a plate member that moves across the axial direction in the flow channel is installed on the upstream side of the exhaust means 15 in order to regulate the pressure of the processing chamber 1 and a discharge region 3 by increasing or decreasing a flow channel cross sectional area that is a cross sectional area on a plane perpendicular to the axial direction of the vacuum exhaust pipe 16 and adjusting the flow rates of gases and particles of plasma 10 in the interior exhausted from the inside of the processing chamber 1 by operation of the exhaust means 15.

An IR (InfraRed) lamp unit for heating the wafer 2 is installed between the stage 4 and the quartz chamber 12 constituting the ICP plasma source. The IR lamp unit mainly has an IR lamp 62, a reflective plate 63 to reflect IR light, and an IR light transmission window 74. A circular lamp is used as the IR lamp 62. Here, the IR lamp 62 emits light mainly in a region from visible light to infrared light. Such light is referred to as IR light here. Although IR lamps 62-1, 62-2, and 62-3 of three rounds are installed as the IR lamp 62 in the configuration shown in FIG. 2, two rounds, four rounds, or other rounds may also be acceptable. The reflective plate 63 for reflecting IR light downward is installed above the IR lamp 62.

An IR lamp power source 64 is connected to the IR lamp 62 and, in the middle, a radio frequency cut filter 25 for preventing noises of radio frequency power for generating plasma generated at the radio frequency power source 20 from flowing in the IR lamp power source 64 is installed. Further, the function of controlling the electric power supplied to the IR lamps 62-1, 62-2, and 62-3 independently from each other is given to the IR lamp power source 64 and the distribution of heat amounts for a wafer in radial directions can be controlled.

A gas flow channel 75 for flowing the gases supplied from the mass flow controllers 50 to the interior of the quartz chamber 12 toward the side of the processing chamber 1 is formed in the center of the IR lamp unit. Then a slit plate (ion shielding plate) 78 having a plurality of holes for shielding ions and electrons generated in the plasma generated in the interior of the quartz chamber 12, transmitting only a neutral gas and a neutral radical, and irradiating the wafer 2 is installed in the gas flow channel 75.

A flow channel 39 of a refrigerant for cooling the stage 4 is formed in the interior of the stage 4 and the refrigerant is circulated and supplied by a chiller 38. Further, electrostatic attraction electrodes 30 that are tabular electrodes are embedded into the stage 4 in order to fix the wafer 2 to the stage 4 by electrostatic attraction and DC (Direct Current) power sources 31 for electrostatic attraction are connected respectively.

Further, a He gas can be supplied between the rear surface of the wafer 2 placed above the stage 4 and the stage 4 in order to cool the wafer 2 efficiently. Furthermore, a wafer mounting surface of the stage 4 is coated with a resin such as a polyimide in order to prevent the rear surface of the wafer 2 from being damaged even when the wafer 2 is heated or cooled while being attracted electrostatically by activating the electrostatic attraction electrodes 30. In addition, a thermocouple 70 for measuring the temperature of the stage 4 is installed in the interior of the stage 4 and the thermocouple is connected to a thermocouple thermometer 71.

Moreover, optical fibers 92-1 and 92-2 for measuring the temperature of the wafer 2 are installed at three places in the vicinities of the center of the wafer 2 placed over the stage 4, the middle of the wafer 2 in a radial direction, and the outer circumference of the wafer 2. The optical fiber 92-1 guides IR light from an external IR light source 93 to the rear surface of the wafer 2 and irradiates the rear surface of the wafer 2. On the other hand, the optical fiber 92-2 collects IR light penetrating the wafer 2 and being reflected by the wafer 2, of the IR light emitted by the optical fiber 92-1 and transmits the collected IR light to a spectroscope 96.

External IR light generated at the external IR light source 93 is transmitted to an optical path switch 94 for turning on/off an optical path. Successively, the external IR light is branched to multiple beams by a light distributor 95 (branched to three beams in the case of FIG. 2) and applied to respective positions on the rear side of the wafer 2 through the three systems of the optical fiber 92-1.

The IR light absorbed and reflected by the wafer 2 is transmitted to the spectroscope 96 through the optical fiber 92-2 and wavelength-dependence data of spectral intensity are obtained by a detector 97. Then the obtained wavelength-dependence data of spectral intensity are sent to an arithmetic unit 41 in a control unit 40, an absorption wavelength is calculated, and the temperature of the wafer 2 can be obtained on the basis of the computed absorption wavelength. Further, an optical multiplexer 98 is installed in the middle of the optical fiber 92-2 and, with respect to light to be dispersed and measured, at what measurement point of the wafer center, the wafer middle, and the wafer outer circumference light is to be dispersed and measured can be switched. From this, the arithmetic unit can obtain the respective temperatures of the wafer center, the wafer middle, and the wafer outer circumference.

In FIG. 1, 60 is a container to cover the quartz chamber 12 and 81 is an O-ring for vacuum sealing between the stage 4 and the bottom surface of the base chamber 11.

The control unit 40 controls on/off of radio frequency power supply from the radio frequency power source 20 to the ICP coil 34. Further, the control unit 40 controls the integrated mass flow control unit 51 and adjusts the types and flow rates of gases supplied from respective mass flow controllers 50 to the interior of the quartz chamber 12. In the state, the control unit 40 further operates the exhaust means 15, controls the pressure regulating means 14, and adjusts the interior of the processing chamber 1 so as to be a desired pressure.

Further, the control unit 40, in the state of operating the DC power sources 31 for electrostatic attraction, making the wafer 2 electrostatically attracted by the stage 4, and operating the mass flow controller 50-6 to supply the He gas between the wafer 2 and the stage 4, controls the IR lamp power source 64 and the chiller 38 so that the temperature of the wafer 2 may fall within a predetermined temperature range on the basis of the temperature of the interior of the stage 4 measured by the thermocouple thermometer 71 and the temperature distribution information of the wafer 2 obtained by the arithmetic unit 41 on the basis of spectrum intensity information in the vicinities of the center, the middle in a radial direction, and the outer circumference of the wafer 2 measured by the detector 97.

Figure 2:
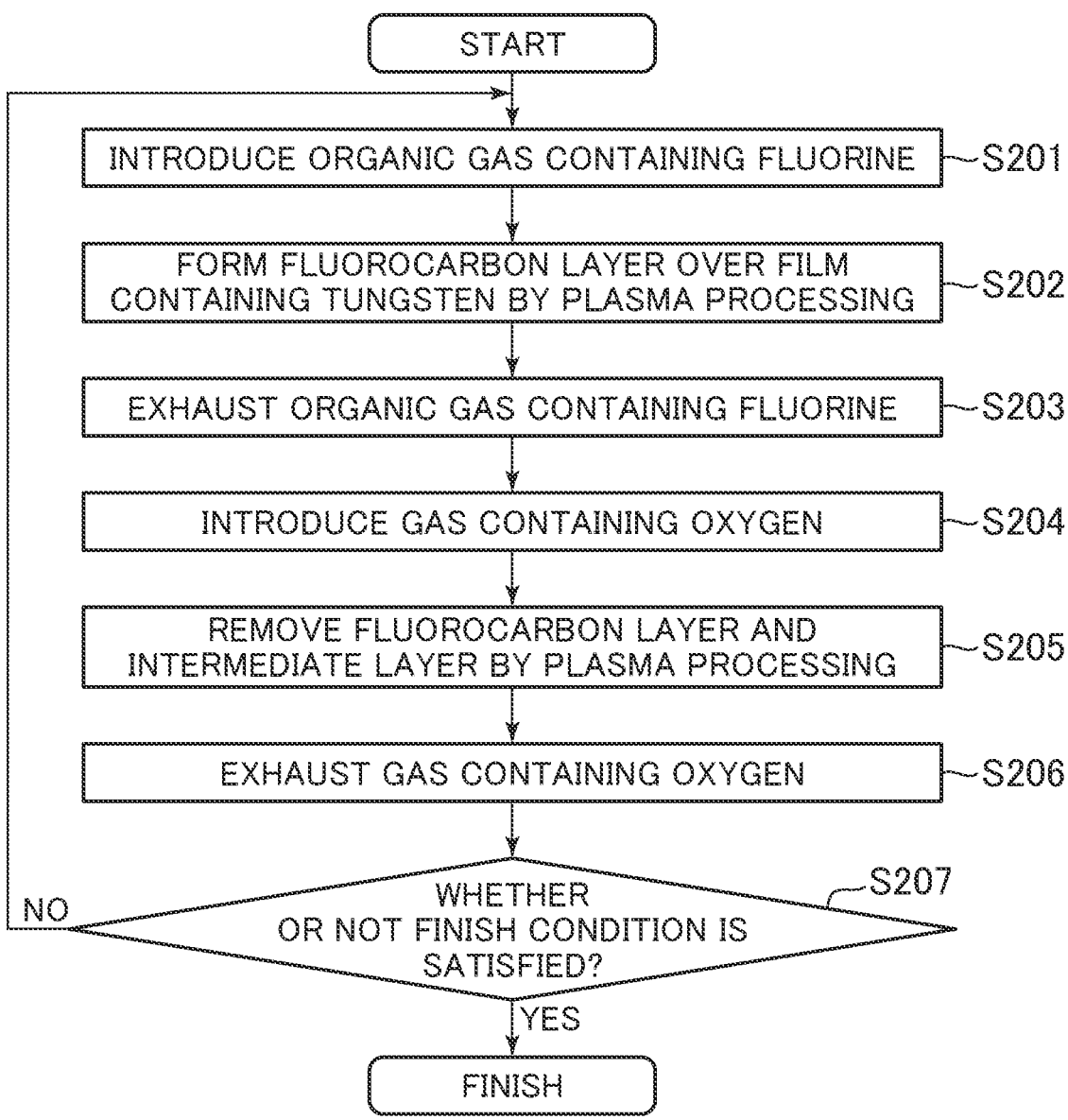
FIG. 2 is a flowchart showing the outline of the flow of etching treatment of a film that is formed over a wafer beforehand and contains tungsten, the etching treatment being implemented by a plasma processing apparatus according to an embodiment of the present invention.

Flow of processing of a wafer 2 implemented by a plasma processing apparatus 100 according to the present embodiment is explained in reference to FIG. 2. FIG. 2 is a flowchart showing the outline of the flow of etching treatment of a film that is formed over a wafer beforehand and contains tungsten, the etching treatment being implemented by a plasma processing apparatus according to an embodiment of the present invention.

In the figure, before the processing of a wafer 2 starts, the wafer 2 on the surface of which a film structure including a film layer containing tungsten is arranged beforehand is placed over a stage 4 in a processing chamber 1 and retained by electrostatic force formed by supplying direct current power from a DC power source to electrostatic attraction electrodes 30.

After the start of the processing, at Step S201, an organic gas containing fluorine is introduced into the processing chamber 1. Here, the film containing tungsten represents a metallic film comprising a plurality of elements including tungsten in addition to a tungsten simple film. Concrete examples are WN, $WSi_2$, and the like. Further, examples of the organic gas containing fluorine include, in addition to $C_4F_8$, $CHF_3$, $CH_2F_2$, $CH_3F$, and the like, a mixed gas formed by diluting those gases with argon, nitrogen, and oxygen. Further, a wafer temperature at the present step is kept constant by temperature control function of the stage over which the wafer is placed.

Successively, at Step S202, particles having reactivity such as radicals (active species) including CFx generated by activating atoms or molecules in the organic gas containing fluorine in plasma 10 generated by using the organic gas in the interior of a discharge region 2 are supplied to the surface of the wafer 2 through a gas flow channel 75 and through-holes of a slit plate 78 and attach to the surface of the film containing tungsten. The reactive particles react with the material of the surface of the film to which the reactive particles have attached and a fluorocarbon layer having a thickness determined by conditions of generating the plasma 10 and processing conditions such as the temperature of the stage 4 is formed.

Examples of the composition of a fluorocarbon layer generated over the surface of the film containing tungsten include, in addition to CFx, CHxFy generated when plasma containing hydrogen is used and the like. CHxFy may sometimes be called as a hydrofluorocarbon layer but is unified into the term called fluorocarbon layer here. On this occasion, an intermediate layer containing tungsten and fluorine in the film layer to be processed and being self-limiting is formed at the boundary between the surface of the tungsten film and the fluorocarbon layer.

The thickness of the intermediate layer formed here varies in response to the temperature of the stage 4 or the surface of the wafer 2. The thickness of the intermediate layer therefore is adjusted by adjusting the temperature of the stage 4. In contrast, when the temperature of the wafer 2 is too low, the thickness of the intermediate layer is small, the magnitude of an etching amount per unit time that will be explained later is small, and the number of wafers 2 processed in a predetermined time (throughput) lowers. In the present embodiment, the temperature of the wafer 2 or the stage 4 at Step S202 is adjusted to 0° C. or higher.

Successively, after it is confirmed by a control unit 40 that an intermediate layer of a predetermined thickness is formed by a film thickness detector or by confirming the lapse of a predetermined time, a pressure regulating means 14 increases the flow channel sectional area of a vacuum exhaust pipe 16, increases a displacement, largely depressurizes the interior of the processing chamber 1, and rapidly discharges the organic gas containing fluorine supplied into the processing chamber 1. Through this, the processing for forming the fluorocarbon layer finishes (Step S203). On this occasion, it is also possible to supply an inert (noble) gas such as Ar into the interior of the processing chamber 1 in the manner of replacing the organic gas and promote the exhaust of the organic gas.

Successively, at Step S204, a gas containing oxygen is introduced into the processing chamber 1 as a reactive gas for removing the fluorocarbon layer and the intermediate layer. As the gas containing oxygen, not only 02 and 03 but also a mixed gas formed by diluting those gases with argon, nitrogen, and the like may be used. The temperature of the wafer 2 at this step is kept constant by temperature adjustment function of the stage 4 over which the wafer 2 is placed.

Successively, at Step S205, the gas containing oxygen is supplied to the discharge region 3, plasma 10 is generated, atoms or molecules of the gas are activated, and the generated particles having reactivity such as radicals (active species) are supplied to the surface of the wafer 2 through a gas flow channel 75 and through-holes of a slit plate 78. As a result, the reaction between the active species including the radicals of oxygen and the fluorocarbon layer and the intermediate layer is generated and a reaction product having volatility is generated. The reaction product is sublimated or detached from the wafer 2 or the film structure of the surface because of the volatility and is removed from the surface of the film containing tungsten.

Examples of the reaction product include CO, $CO_2$, COFx, WFx, and WOxFy. The particles of the reaction product detached from the wafer 2 are exhausted from the interior of the processing chamber 1 by operation of exhaust in the interior of the processing chamber 1 by operation of the pressure regulating means 14 or the exhaust means 15 or flow of the transfer of the particles in the interior of the processing chamber 1 caused by the operation. Successively, at Step S206, the gas containing oxygen is exhausted from the interior of the processing chamber 1.

One cycle formed by combining the above Steps S201 to S206 finishes. Since the intermediate layer is removed together with the fluorocarbon layer by the cycle, the tungsten film is removed by the thicknesses of the film layers and the film thickness reduces. The change of the film thickness is an etching amount per one cycle.

Successively, in the control unit 40, whether or not the conditions for finish including whether or not a desired etching amount has been attained from the result obtained by receiving an output from a film thickness detector not shown in the figure or whether or not the number of the above cycles delivering that a desired etching amount can be obtained from pre-test or the like is implemented have been satisfied is judged (Step S207). When it is judged that the conditions are satisfied, the etching treatment of the film containing tungsten finishes but, when it is judged that the conditions are not satisfied, the process returns to Step S201 and the cycle is implemented again. In this way, in the present embodiment, the above cycle is implemented repeatedly until a desired etching amount is obtained.

Figure 3:
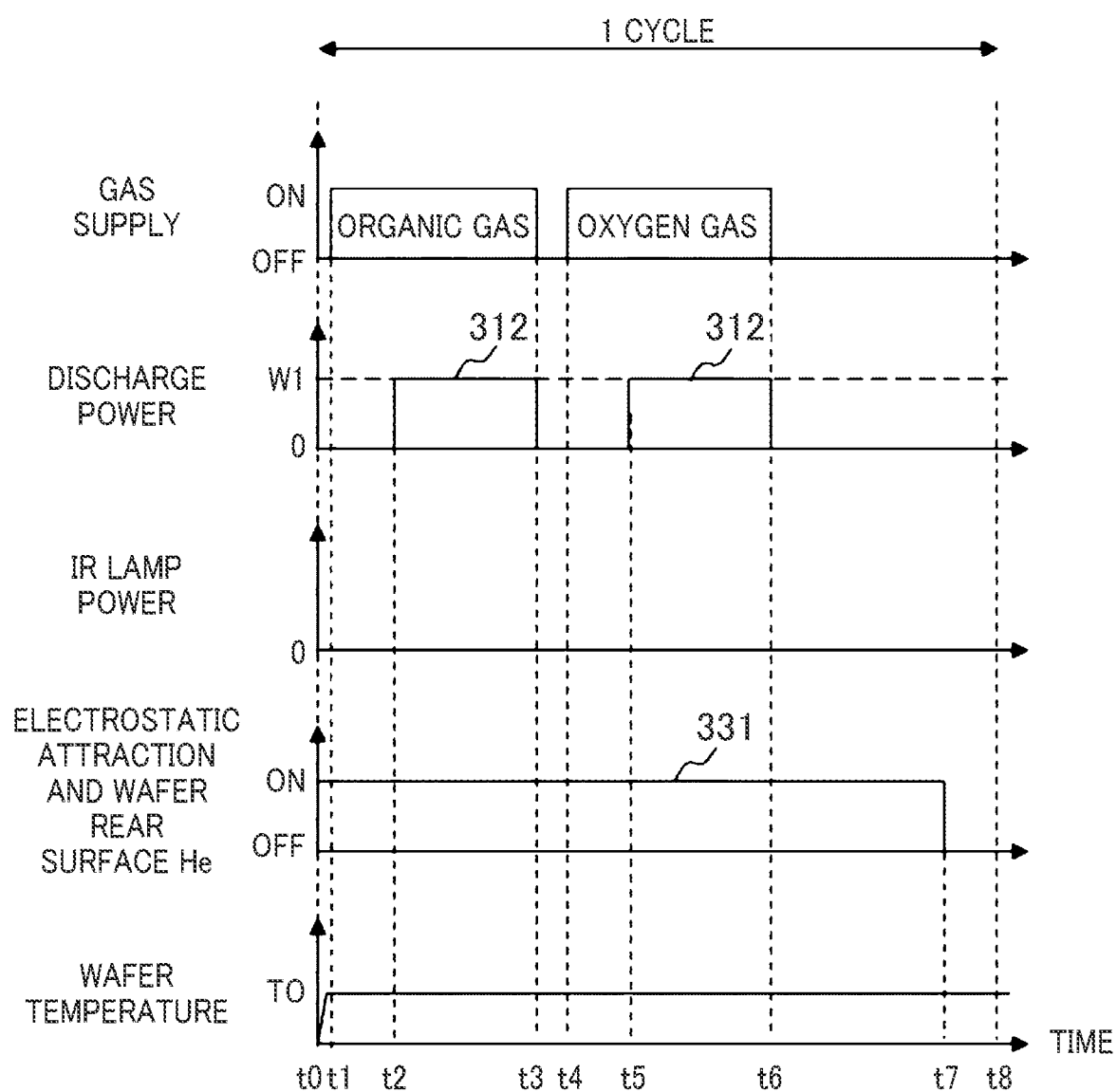
FIG. 3 is a time chart showing the changes with the lapse of time of a plurality of parameters included in processing conditions during processing of a wafer according to the embodiment shown in FIG. 1.
Figure 4:
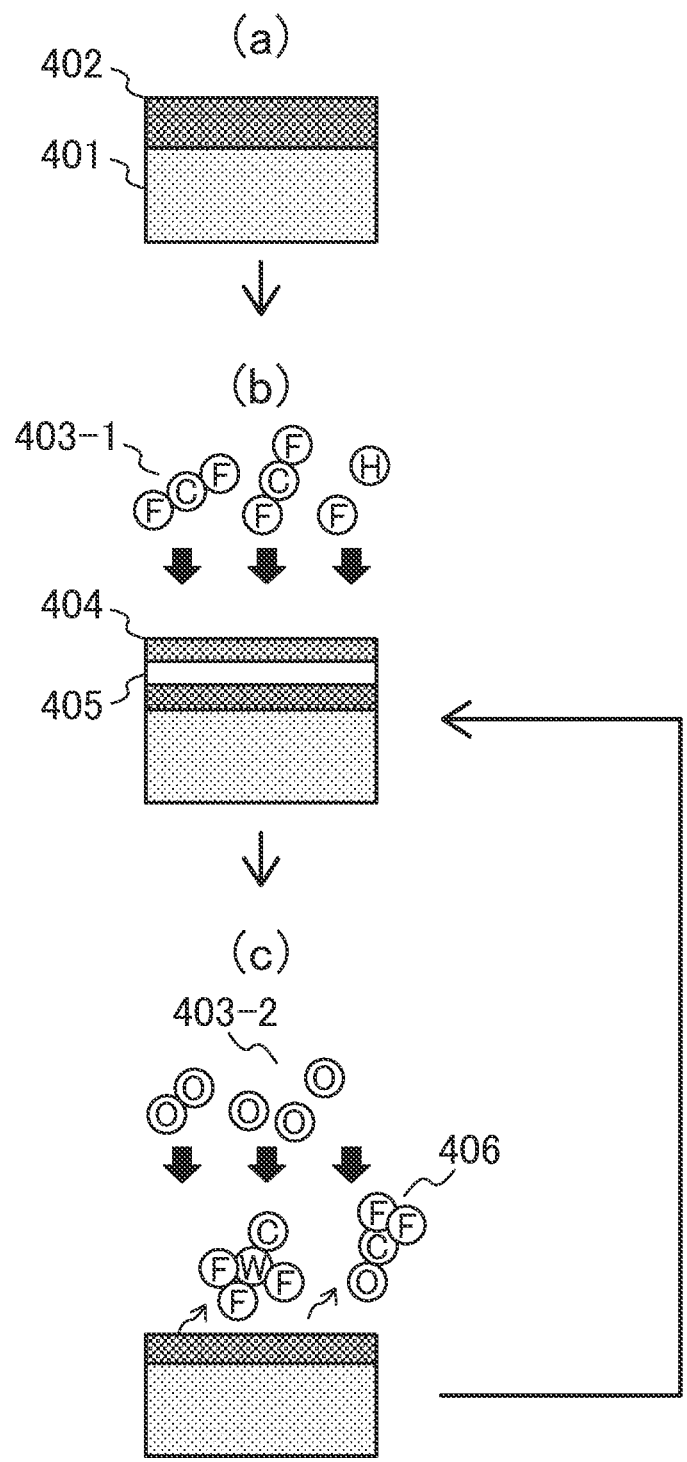
FIG. 4 is a view schematically showing the outline of change in a film structure including a film containing tungsten during processing of a wafer according to the embodiment shown in FIG. 3.

Order of operations when a film containing tungsten over a wafer 2 is etched with a plasma processing apparatus 100 according to the present embodiment by using $CHF_3$ as a gas for forming a fluorocarbon layer and an intermediate layer and an $O_2$ gas as a reactive gas for removing the fluorocarbon layer and the intermediate layer is explained hereunder in reference to FIGS. 3 and 4. FIG. 3 is a time chart showing the changes with the lapse of time of a plurality of parameters included in processing conditions during processing of a wafer according to the embodiment shown in FIG. 1. As the parameters, from top to bottom, a gas supply flow rate, a discharge power, electrostatic attraction, and a wafer temperature are shown.

FIG. 4 is a view schematically showing the outline of change in a film structure including a film containing tungsten during processing of a wafer according to the embodiment shown in FIG. 3. In FIG. 4 in particular, a structure and the change in the vicinity of the surface of a tungsten film 402 in a film structure in which the tungsten film 402 is stacked and arranged over a base film 401 of a wafer 2 with the border interposed in between is schematically shown.

Firstly, at time t0 during processing, after a wafer 2 in which a film structure having a base film 401 and a tungsten film 402 to be etched shown in FIG. 4(a) is formed beforehand is carried in a processing chamber 1 through a transfer port (not shown in the figures) installed in the processing chamber 1 and placed over a stage 4, electric power from a DC power source 31 is supplied to electrostatic attraction electrodes 30 and the wafer 2 is attracted electrostatically and retained over a dielectric film over the stage 4 in response to a command signal from a control unit 40. Further, the flow rate of a He gas for cooling a wafer supplied to a gap between the rear surface of the wafer 2 and the stage 4 is adjusted by a mass flow controller 50-6 for the He gas in a mass flow control unit 51, the He gas is supplied, and the pressure of the He gas in the gap is adjusted to a value in a predetermined range in response to a command signal from the control unit 40 (state of 331). As a result, heat transfer between the stage 4 and the wafer 2 is promoted and the temperature of the wafer 2 comes to be a value T0 close to the temperature of the stage 4 in which a refrigerant set at a predetermined temperature beforehand by a chiller 38 is supplied to and circulates in a flow channel 39 of the refrigerant. In the present embodiment, the temperature T0 of the wafer 2 is set at 40° C.

Successively, at time t1, the flow rates of a plurality of gases supplied by respective mass flow controllers for the multiple gases including a mass flow controller 50-2 or 50-3 for $CHF_3$ in mass flow controllers 50 are adjusted, a gas formed by mixing gases of the multiple kinds of materials is supplied as a gas for processing into the processing chamber 1 at a flow rate in a predetermined range, the opening of a pressure regulating means 14 is adjusted, and the pressure in the interior of the processing chamber 1 and in a discharge region 3 in the interior of a quartz chamber 12 is set at a value in a predetermined range in response to a command signal from the control unit 40. In the state, at time t2, radio frequency power of a predetermined value W from a radio frequency power source 20 is supplied to an ICP coil (state of 312), plasma discharge starts in the discharge region 3 in the interior of the quartz chamber 12, and plasma 10 is generated in the interior of the quartz chamber 12 in response to a command signal from the control unit 40. On this occasion, electric power is not supplied to an IR lamp 62 in order to keep the temperature of the wafer 2 while the plasma 10 is generated equal to the temperature of the wafer 2 before the plasma 10 is generated.

In the state, at least some of the particles in the $CHF_3$ gas are excited, dissociated, or ionized by the plasma 10 and reactive particles such as charged particles including ions or an active species are formed. The reactive particles such as the active species formed in the discharge region 3 and a neutral gas pass through a slit or through-holes formed in a slit plate 78, are introduced into the processing chamber 1, and are supplied to the surface of the wafer 2. As shown in FIG. 4(b), an active species 403 including CFx and the like is attracted to the surface of the tungsten film 401 of the wafer 2 and interacts with the material of the tungsten film 401 and a fluorocarbon layer 404 is formed.

In the present embodiment, ions generated in the plasma 10 in the discharge region 3 are prevented from moving into the processing chamber 1 and hardly enter the surface of the wafer 2 by arranging the slit plate 78 in a gas flow channel 75. Interaction between the ions generated in the plasma 10 and the film structure over the wafer 2 therefore reduces and etching of the tungsten film 402 is inhibited from progressing.

Meanwhile, the thickness of the fluorocarbon layer 404 formed over the tungsten film 402 depends on the time of interaction between the reactive particles of $CHF_3$ and the material of the surface of the tungsten film 402 and increases as the time increases. In the present embodiment, the time during which the interaction occurs is a time equivalent to the time during which the plasma 10 is formed in the discharge region 3 or an approximately equivalent time to the extent of being regarded as the time.

On the other hand, an intermediate layer 405 in which tungsten, fluorine, and carbon are mixed is formed at the boundary between the surface of the tungsten film 402 and the fluorocarbon layer 404 formed on it. According to the studies by the present inventors, it has been confirmed that the thickness of the intermediate layer 405, similarly to the fluorocarbon layer 404, depends on the time of interaction between the reactive particles of $CHF_3$ and the material of the surface of the tungsten film 402 and increases as the time increases but the thickness of the intermediate layer 405 stops increasing after 10 seconds have elapsed since the intermediate layer 405 started to be formed. In consideration of such self-limiting nature of the intermediate layer 405, the time during which the plasma 10 using the $CHF_3$ gas is formed in the discharge region 3 is set at 10 seconds in the present embodiment.

That is, in FIG. 3, at time t3 after 10 seconds or more have elapsed since radio frequency power started to be supplied from the radio frequency power source 20 to the ICP coil 34 at time t2 in FIG. 3, the output of the radio frequency power from the radio frequency power source 20 stops and the supply of the processing gas containing the $CHF_3$ gas to the discharge region 3 stops in response to a command signal from the control unit 40. As a result, the plasma 10 in the discharge region 3 disappears. Further, between time t3 and time t4, the processing gas containing the $CHF_3$ gas, the reactive particles, and the particles of a reaction product and the like generated while the fluorocarbon layer 404 and the intermediate layer 405 are formed in the processing chamber 1 are exhausted to the exterior of the processing chamber 1 through a vacuum exhaust pipe 16 the opening of which is adjusted by the pressure regulating means 14 and through an exhaust means 15.

A processing gas containing an oxygen gas the flow rate of which is adjusted to a value in a predetermined range by a mass flow controller 50-2 is supplied to the discharge region 3 at time t4 in response to a command signal from the control unit 40. Further, the pressure regulating means 14 adjusts the opening of the flow channel of the vacuum exhaust pipe 16 and the pressure in the processing chamber 1 and the discharge region 3 in the interior of the quartz chamber 12 is adjusted to a value in a predetermined allowable range by the balance between the amount of the supplied processing gas containing oxygen and the amount of the exhaust gas from the vacuum exhaust pipe 16. In the state, at time t5, radio frequency power from the radio frequency power source 20 is supplied to the ICP coil 34 (state of 312) and plasma 10 using the processing gas containing oxygen is generated in the discharge region 3 in the interior of the quartz chamber 12 in response to a command signal from the control unit 40.

Although the magnitude of the radio frequency power outputted from the radio frequency power source 20 at time t5 is set at the same W1 as the output at time t2 in the present embodiment, a different value may also be adopted in accordance with processing conditions. Further, in the present embodiment, electric power to operate the IR lamp 62 is not supplied even while the plasma 10 is generated in order to keep the temperature of the wafer 2 at T0=40° C. which is equivalent to the temperature of the wafer 2 before the plasma 10 is generated.

In the state, at least some of the particles in an oxygen ($O_2$) gas are excited, dissociated, and ionized by the plasma 10 and reactive particles such as charged particles including ions or an active species are formed. A neutral gas and the reactive particles such as the reactive species formed in the discharge region 3 pass through the slit or the through-holes formed in the slit plate 78, are introduced into the processing chamber 1, and are supplied to the surface of the wafer 2. As shown in FIG. 4(c), the active species 403 including radicals of oxygen interacts with the materials of the fluorocarbon layer 404 and the intermediate layer 405 in the wafer 2 and a reaction product 406 having volatility is generated, volatilized, detached from the surface of the film structure of the wafer 2, and thus removed from the surface.

In the present embodiment, the slit plate 78 is arranged in the gas flow channel 75, so that ions generated in the plasma 10 in the discharge region 3 are prevented from moving into the processing chamber 1 and hardly enter the surface of the wafer 2. As a result, except the fluorocarbon layer 404 and the intermediate layer 405, interaction between the ions generated in the plasma 10 and the film structure over the wafer 2 reduces and etching of the tungsten film 402 remaining as the base is inhibited from progressing.

Meanwhile, an amount of the removed fluorocarbon layer 404 and intermediate layer 405 depends on the time of interaction between the reactive particles including oxygen radicals and the materials of the surfaces of the layers and the temperature of the surface of the wafer 2 where the interaction occurs, and increases as the time increases. In the present embodiment, the time during which the interaction occurs is a time equivalent to the time during which the plasma is formed in the discharge region 3 or an approximately equivalent time to the extent of being regarded as the time. According to the studies by the present inventors, under the processing conditions including the temperature of the wafer 2 in the present embodiment, if the time elapses for 10 seconds, almost all of the fluorocarbon layer 404 and the intermediate layer 405 formed at the step in the processing between time t2 and time t3 corresponding to Step S203 in FIG. 2 change to the reaction product 406 and are detached and removed from the surface of the film structure.

That is, the etching of the fluorocarbon layer 404 and the intermediate layer 405 finishes in a self-limiting manner in 10 seconds or by time t6 after the radio frequency power starts to be supplied from the radio frequency power source 20 to the ICP coil 34 at time t5 in FIG. 3. At time t6, the output of the radio frequency power from the radio frequency power source 20 to the ICP coil 34 stops, the supply of the processing gas containing the 02 gas to the discharge region 3 stops, and the formation of the plasma 10 in the interior of the discharge region 3 stops in response to a command signal from the control unit 40. In the present embodiment, the step from time t5 to time t6 corresponds to Step S206 shown in FIG. 2 and the time is 10 seconds or longer as stated above.

Successively, the gas in the processing chamber 1 is exhausted to the exterior of the processing chamber 1 through the vacuum exhaust pipe 16 the opening of which is adjusted by the pressure regulating means 14 and the exhaust means 15 between time t6 and time t7 in response to a command signal from the control unit 40. Further, at a time after time t6, as it has been explained in FIG. 2, whether or not the etching amount or the remaining film thickness of the tungsten film 402 over the wafer 2 reaches a predetermined value is judged (corresponding to Step S207) and the process of starting the next cycle or finishing the processing of the wafer 2 is implemented in response to the judgment result.

When the next cycle starts, at time t7 or at any time t8 thereafter, a processing gas containing a $CHF_3$ gas starts to be introduced into the discharge region 3 similarly to the operation from time t1 in response to a command signal from the control unit 40. When the processing of the wafer 2 finishes, at time t7, the supply of the He gas that has been supplied to the gap between the rear surface of the wafer 2 and the upper surface of the stage 4 stops, a valve 52 opens, the He gas is exhausted from the gap, the pressure in the gap is made approximately equal to the pressure in the processing chamber, and the process of releasing the electrostatic attraction of the wafer 2 including the removal of static electricity is implemented. That concludes the process of etching the tungsten film 402.

Figure 5:
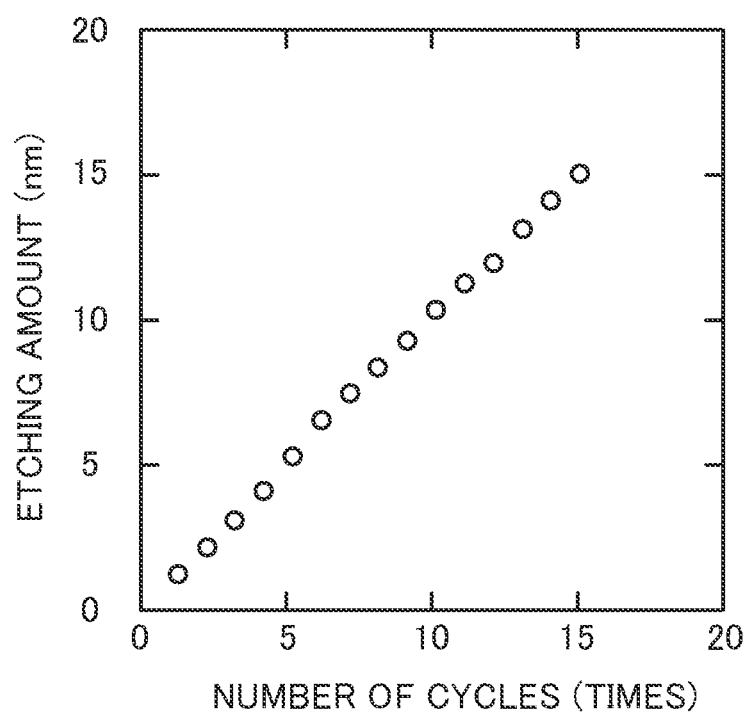
FIG. 5 is a graph showing a relationship between a number of cycles and an amount of etching in an etching treatment implemented by a plasma processing apparatus according to the present embodiment shown in FIG. 1.

When an etching amount of 15 nm is required in the present embodiment, the etching finishes by repeating the above cycle 15 times. FIG. 5 is a graph showing a relationship between a number of cycles and an amount of etching in an etching treatment implemented by a plasma processing apparatus according to the present embodiment shown in FIG. 1. In the figure, the horizontal axis represents a number of cycles and the vertical axis represents an etching amount (etching depth) detected after an implemented cycle finishes before a next cycle starts by using in-situ ellipsometry.

As shown in the figure, in the present example, the etching amount changes almost linearly in proportion to the increase of the number of the cycles. From the figure, it has been clarified that an etching amount per one cycle of a tungsten film is 1.0 nm/cycle in the present embodiment.

As stated above, both the first step of forming a fluorocarbon layer 404 and an intermediate layer 405 and the second step of removing the fluorocarbon layer 404 and the intermediate layer 405 according to the present embodiment have a self-limiting nature. The formation of an intermediate layer 405 in particular is self-limiting and the process of forming and detaching a reaction product 406 therefore finishes in a self-limiting manner. From this, in the present embodiment, when a wafer 2 in which a film structure having a circuit pattern is formed beforehand is etched, the variation in directions on a plane direction and a depth direction of the wafer 2 in the etching amount of the surface of a tungsten film 402 after the finish of one cycle can be reduced to make it more uniform.

Since the above self-limiting reaction is used, even when the densities of the reactive particles such as radicals supplied to the wafer 2 are distributed differently depending on positions in a horizontal direction and a depth direction over the upper surface of the wafer 2, the etching amount is inhibited from increasing more than necessary or falling short, and the variation of the etching amount is reduced. Further, a total etching amount can be adjusted by increasing or decreasing the number of cycles by repeating the one cycle including the first and second steps. An etching amount according to the present embodiment is a value obtained by multiplying an etching amount per one cycle by the number of repetition or by summing etching amounts corresponding to the number of cycles. As a result, in the present embodiment, it is possible to improve the controllability of dimensions after processed by etching treatment and the yield of the processing, in comparison with etching by conventional continuous plasma processing.

According to the present embodiment stated above, it is possible to provide an isotropic atomic layer etching technology allowing a tungsten film to be etching-processed with a high degree of evenness in directions on a wafer plane direction and a pattern depth direction and a high processing dimensional controllability of an atomic layer level.

Modified Example

A modified example of the embodiment stated above is explained in reference to FIGS. 6 to 8 and 10. Here, the items in the first embodiment can apply also to the present embodiment unless there are specific circumstances. The present example explains an example of applying atomic layer etching isotropically to a film containing tungsten similarly to the above embodiment.

Differences of the present example from the above embodiment are: to form plasma 10 using a gas containing a $C_4F_8$/Ar gas in the process of forming a fluorocarbon layer 404; to heat a wafer 2 by radiation of infrared from an IR lamp 62 and form an intermediate layer 405; to form plasma 10 using a gas containing an $O_2$/Ar gas and heat the wafer 2 by radiant heat of infrared of the IR lamp 62 in the process of removing the fluorocarbon layer 404 and the intermediate layer 405; and thus to etch a film containing tungsten by using heat cycle. In the present example, accuracy of adjusting the film thickness of an intermediate layer 405, namely controllability of an etching amount per one cycle, can be improved.

Figure 6:
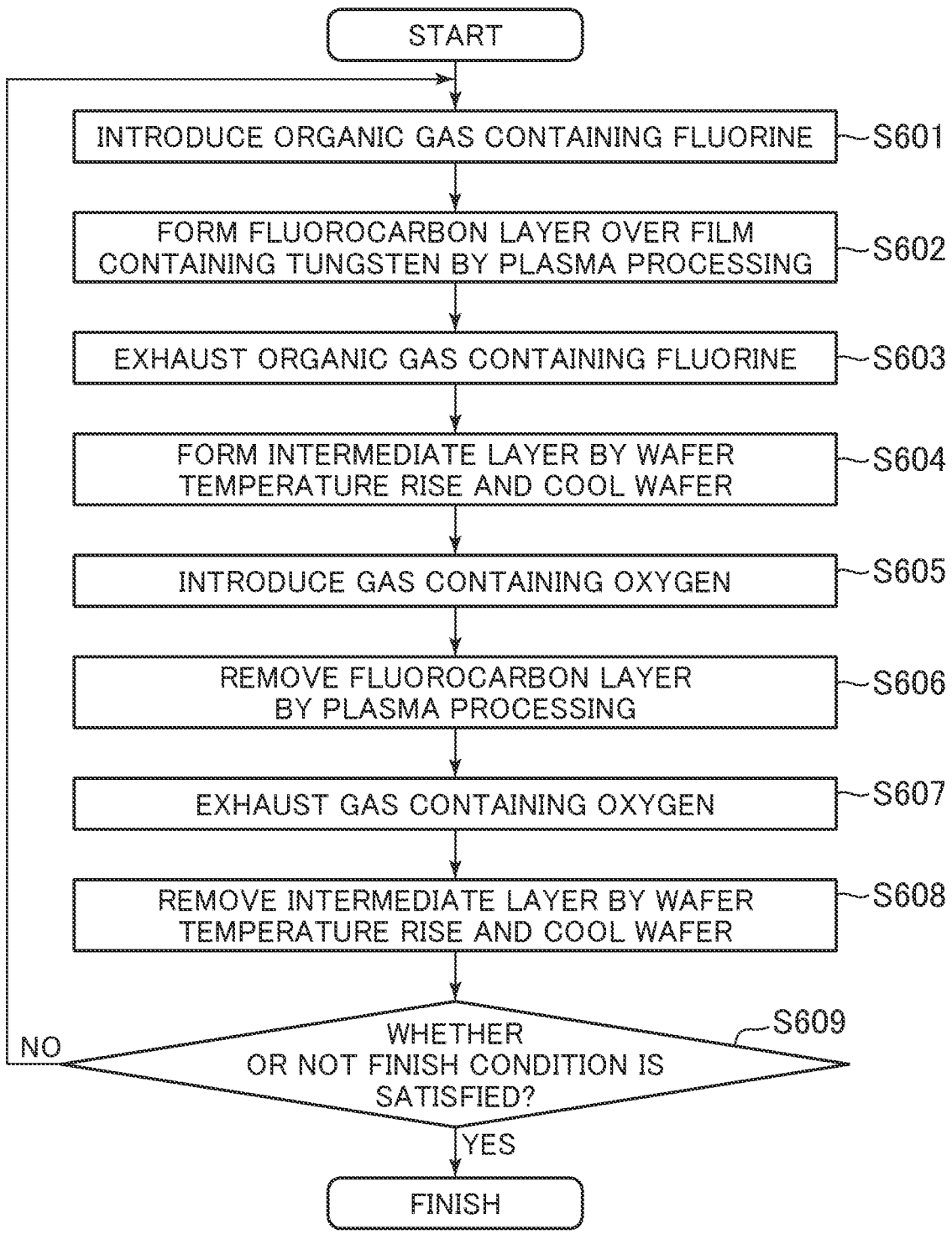
FIG. 6 is a flowchart showing the outline of a processing flow in a modified example of an etching treatment implemented by a plasma processing apparatus according to the embodiment shown in FIG. 1.

FIG. 6 is a flowchart showing the outline of a processing flow in a modified example of an etching treatment implemented by a plasma processing apparatus according to the embodiment shown in FIG. 1. In the modified example in this figure too, in a plasma processing apparatus 100, before the processing of the wafer 2 starts, a wafer 2 over the surface of which a film structure including a film layer containing tungsten is arranged beforehand is placed over a stage 4 in a processing chamber 1 and retained by electrostatic force formed by supplying direct current power from a DC power source to electrostatic attraction electrodes 30.

After the processing starts, at Step S601, an organic gas containing fluorine is introduced into the processing chamber 1 in which the wafer 2 having a film containing tungsten on the surface side is placed. In the present example, as the organic gas containing fluorine, a gas containing $C_4F_8$ and Ar is used. The temperature of the wafer 2 at the present step is kept at a temperature in a predetermined allowable range by the temperature adjustment function of the stage 4 over which the wafer 2 is placed and, in the present example in particular, the temperature of the upper surface of the stage 4 or the wafer 2 is adjusted so as to be −5° C.

Successively, at Step S602, plasma 10 is generated by using the organic gas in a discharge region 2 and reactive particles such as radicals (active species) including CFx and the like generated by activating atoms or molecules of the processing gas containing the gases of $C_4F_8$ and Ar in the plasma 10 pass through a gas flow channel 75 and throughholes of a slit plate 78 and attach to the surface of the film containing tungsten over the surface of the wafer 2. The reactive particles react with the material of the surface of the film to which the reactive particles have attached, and a fluorocarbon layer having a thickness determined by conditions of generating the plasma 10 and processing conditions such as the temperature of the stage 4 is formed over the upper surface of the film.

Although an intermediate layer in which tungsten that is the target of processing, fluorine, and carbon are mixed is generated at the boundary between the lowermost surface of the formed fluorocarbon layer and the upper surface of the film containing tungsten. However, since the temperature of the stage 4 in the case of the present example is kept at −5° C. that is relatively lower than the above embodiment, the film thickness of the intermediate layer is 0.1 nm or less that is smaller than the embodiment. In the present example, the intermediate layer formed at the step of forming the fluorocarbon layer by interaction with the reactive particles from plasma using the organic gas is increased to a desired thickness with a high degree of controllability at the next process of heating it by the irradiation of infrared from an IR lamp 62.

In the present example therefore, it is suitable to maintain the temperature of the stage 4 and thus the wafer 2 at a temperature lower than the embodiment and implement above Step S602. When the temperature of the stage 4 is too low at Step S602 however, it is concerned that difference of temperature conditions at the processes within one cycle implemented after the heating process or the like increases, the time required for heating and cooling increases, and the throughput of the processing may lower. Accordingly, in the present example, it is desirable to maintain the stage temperature during the implementation of the process of Step S602 so that the temperature of the wafer 2 may be −30° C. or higher.

After Step S602 finishes, the processing chamber 1 is exhausted rapidly by operations of a pressure regulating means 14 and an exhaust means 15, the reactive particles and the particles of the processing gas in the processing chamber 1 such as the organic gas are removed, and the process of forming the fluorocarbon film finishes in response to a command signal from the control unit 40 (Step S603). On this occasion, it is also possible to supply an inert (noble) gas such as Ar to the interior of the processing chamber 1 so as to replace the organic gas and promote the discharge of the organic gas.

Successively, at Step S604, an intermediate layer containing tungsten and fluorine of a desired thickness is formed at a boundary plane between the film containing tungsten and the fluorocarbon layer by heating the upper surface of the wafer 2 to a temperature of 50° C. or higher and maintaining the temperature for a predetermined time. In the process of raising the temperature of the wafer 2, fluorine and the like included in CFx of the fluorocarbon layer diffuse in the film containing tungsten and the intermediate layer is formed. Successively, the wafer 2 is cooled and the temperature of the wafer 2 is lowered rapidly to a temperature of starting the succeeding process at Step S605 or lower.

At Step S605, a processing gas containing 02 and Ar gases is supplied to the discharge region 3. Successively, at Step S606, plasma 10 is formed by using the processing gas, reactive particles such as radicals (active species) formed by activating atoms or molecules in the gas are introduced into the processing chamber 1, and the reactive particles are supplied to the surface of the film containing tungsten of the wafer 2. As a result, reaction between the active species including the $O_2$ radicals and the materials of the fluorocarbon layer and the intermediate layer occurs, a reaction product having volatility is generated, and the reaction product is sublimated or detached from the wafer 2 or the film structure of the surface because of the volatility and is removed from the surface of the film containing tungsten.

Examples of the reaction product that volatilizes on this occasion include CO and $CO_2$. The temperature of the wafer 2 at the present step is adjusted to −5° C. by temperature adjustment function of the stage 4 over which the wafer 2 is placed. The particles of the reaction product detached from the wafer 2 are exhausted from the interior of the processing chamber 1 by operation to discharge particles of the $O_2$ or Ar gas in the interior of the processing chamber 1 caused by operation of the pressure regulating means 14 or the exhaust means 15, or flow of the transfer of the particles in the interior of the processing chamber 1 caused by the operation and the process of removing the fluorocarbon layer finishes. Successively, at Step S607, the gas containing $O_2$ and Ar is exhausted from the interior of the processing chamber 1.

Successively, at Step S608, the intermediate layer remaining over the surface of the film containing tungsten is removed by heating the wafer 2, raising the temperature of the surface of it to a temperature of 150° C. or higher, and maintaining the temperature for a predetermined time. The intermediate layer is decomposed, volatilized, and removed from the surface of the film containing tungsten during the process of raising the temperature of the wafer 2.

One cycle formed by combining the above Steps S601 to S608 is finished. Since the intermediate layer is removed together with the fluorocarbon layer by the cycle, the film containing tungsten is removed to the extent of the thicknesses of the film layers and the film thickness reduces. The change of the film thickness is an etching amount per the one cycle stated above.

Successively, the wafer 2 is cooled and the temperature is lowered rapidly to a temperature allowing Step S601 to start. Successively, in the control unit 40, whether or not the conditions for finish including whether or not a desired etching amount has been attained from the result obtained by receiving an output from a film thickness detector not shown in the figure or whether or not the number of the above cycles delivering that a desired etching amount can be obtained from pre-test or the like is implemented have been satisfied is judged (Step S609). When it is judged that the conditions are satisfied, the etching treatment of the film containing tungsten finishes but, when it is judged that the conditions are not satisfied, the process returns to Step S601 and the cycle is implemented again. In this way, in the present embodiment, the above cycle is implemented repeatedly until a desired etching amount is obtained.

Figure 7:
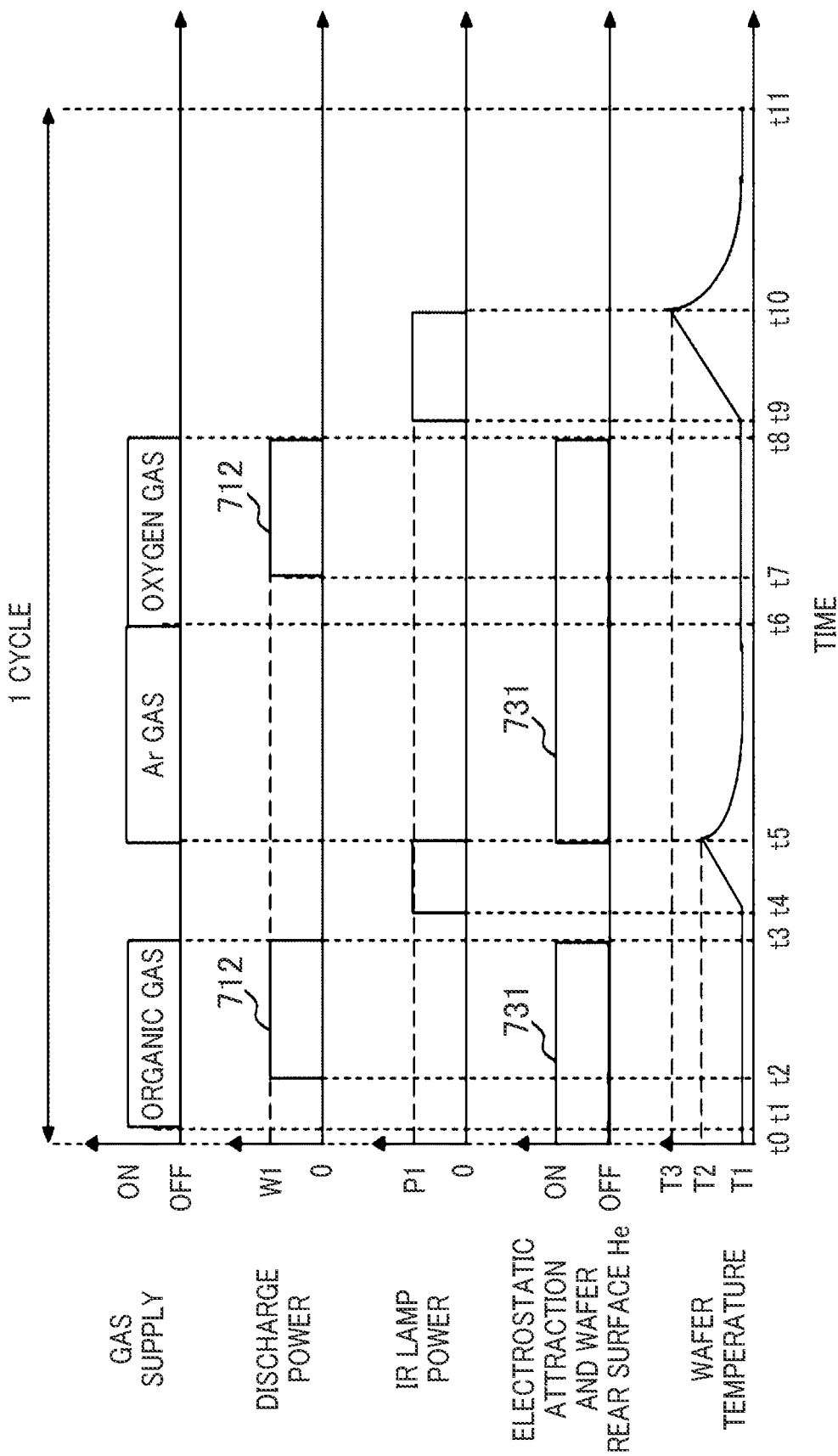
FIG. 7 is a time chart showing the changes with the lapse of time of a plurality of parameters included in processing conditions during processing of a wafer according to the modified example shown in FIG. 6.

Order of operations when a film containing tungsten (tungsten film) according to the present example is etched with a plasma processing apparatus 100 in FIG. 1 by using a processing gas containing $C_4F_8$ and Ar as a gas for forming a fluorocarbon layer, using an IR lamp 62 for heating and forming an intermediate layer, using a processing gas containing $O_2$ and Ar gases for removing the fluorocarbon layer, and using the IR lamp 62 for heating and removing the intermediate layer is explained hereunder in reference to FIG. 7. FIG. 7 is a time chart showing the changes with the lapse of time of a plurality of parameters included in processing conditions during processing of a wafer according to the modified example shown in FIG. 6. As the parameters, from top to bottom, a gas supply flow rate, a discharge power, electrostatic attraction, and a wafer temperature are shown.

Firstly, at time t0 during processing, after a wafer 2 over the upper surface of which a film structure having a tungsten film is formed beforehand is carried in a processing chamber 1 through a transfer port (not shown in the figures) installed in the processing chamber 1 and placed over a stage 4, electric power from a DC power source 31 is supplied to electrostatic attraction electrodes 30 and the wafer 2 is attracted electrostatically and retained over a dielectric film over the stage 4 in response to a command signal from a control unit 40. Further, the flow rate of a He gas for cooling a wafer supplied to a gap between the rear surface of the wafer 2 and the stage 4 is adjusted by a mass flow controller 50-6 for the He gas in a mass flow control unit 51, the He gas is supplied, and the pressure of the He gas in the gap is adjusted to a value in a predetermined range in response to a command signal from the control unit 40 (state of 731). As a result, heat transfer between the stage 4 and the wafer 2 is promoted and the temperature of the wafer 2 comes to be a value T1 close to the temperature of the stage 4 in which a refrigerant set at a predetermined temperature beforehand by a chiller 38 is supplied to and circulates in a flow channel 39 of the refrigerant. In the present embodiment, the temperature T1 of the wafer 2 is set at −5° C.

Successively, at time t1, the respective flow rates of a $C_4F_8$ gas and an Ar gas supplied into the processing chamber 1 by a plurality of mass flow controllers 50-1 and 50-5 in mass flow controllers 50 are adjusted to values in predetermined ranges, a gas formed by mixing the gases of the multiple kinds of materials is supplied into the processing chamber 1 as a processing gas at a flow rate in a predetermined range, the opening of a pressure regulating means 14 is adjusted, and the pressure in the interior of the processing chamber 1 and in a discharge region 3 in the interior of a quartz chamber 12 is controlled to a value in a predetermined range in response to a command signal from the control unit 40. In the state, at time t2, radio frequency power of a predetermined value W2 from a radio frequency power source 20 is supplied to an ICP coil (state of 312), plasma discharge starts in the discharge region 3 in the interior of the quartz chamber 12, and plasma 10 is generated in the interior of the quartz chamber 12 in response to a command signal from the control unit 40. On this occasion, electric power is not supplied to an IR lamp 62 in order to keep the temperature of the wafer 2 while the plasma 10 is generated equal to the temperature of the wafer 2 before the plasma 10 is generated and the temperature of the wafer 2 is maintained at a temperature in a predetermined allowable range including −5° C.

In the state, at least some of the particles of the gas containing $C_4F_8$ and Ar are excited, dissociated, or ionized by the plasma 10 and reactive particles including charged particles such as ions or an active species are formed. The active species formed in the discharge region 3 and a neutral gas pass through a slit or through-holes in a slit plate 79, are introduced into the processing chamber 1, are supplied to the surface of the wafer 2, are attached or attracted to the surface of the tungsten film of the wafer 2, and interact with the material of the film and a fluorocarbon layer CFx is formed.

In the present example too, ions generated in the plasma 10 in the discharge region 3 are prevented from moving into the processing chamber 1 and hardly enter the surface of the wafer 2 by arranging the slit plate 78 in a gas flow channel 75. Interaction between the ions generated in the plasma 10 and the film structure over the wafer 2 therefore reduces and etching of the tungsten film is inhibited from progressing.

The thickness of the fluorocarbon layer formed over the tungsten film depends on the time during which the reactive particles from the plasma 10 using the processing gas containing $C_4F_8$ and Ar and the material of the surface of the tungsten film interact with each other and increases as the time increases. The time during which the interaction occurs is a time equivalent to the time during which the plasma 10 is formed in the discharge region 3 or an approximately equivalent time to the extent of being regarded as the time. According to the knowledge of the inventors, it has been known that 15 seconds is enough as a time for forming an intermediate layer of the present example and the time for forming the plasma 10 using the processing gas containing $C_4F_8$ and Ar in the discharge region 3 is set at 15 seconds in the present example.

That is, at time t3 after 15 seconds or more has elapsed after radio frequency power started to be supplied from the radio frequency power source 20 to the ICP coil 34 at time t2 in FIG. 7, the output of the radio frequency power from the radio frequency power source 20 stops and the supply of the processing gas containing $C_4F_8$ and Ar to the discharge region 3 stops in response to a command signal from the control unit 40. As a result, the plasma 10 in the discharge region 3 disappears. Further, between time t3 and time t4, the processing gas and the reactive particles in the processing chamber 1 and particles of a product and the like generated while the fluorocarbon layer 404 and the intermediate layer 405 are formed are exhausted to the outside of the processing chamber 1 through a vacuum exhaust pipe 16 the opening of which is adjusted by the pressure regulating means 14 and through an exhaust means 15 in response to a command signal from the control unit 40. Furthermore, the supply of the He gas to the gap between the rear surface of the wafer 2 and the upper surface of the stage 4 stops, the direct current power that has been supplied from the DC power source 31 to the electrostatic attraction electrodes 30 stops, the electrostatic attraction force of the wafer 2 is released or reduced, a valve 52 opens, the He gas in the gap is exhausted to the exterior, and the pressure in the gap comes to be the same as the pressure in the processing chamber 1 or an approximate pressure to the extent of being regarded as the same.

Successively, at time t4, electric power is supplied at an output P1 from an IR lamp power source 64 to an IR lamp 62 and infrared is emitted from the IR lamp 62 to the wafer 2 in the processing chamber 1 in response to a command signal from the control unit 40. The IR light emitted from the IR lamp 62 is transmitted through an IR light transmission window 74, the wafer 2 is irradiated with the IR light and heated, and the temperature rises. At t5 after the lapse of a predetermined time (10 seconds in the present example) from time t4, the temperature of the wafer 2 reaches a temperature of T2=50° C. or higher. At time t5, the output of the electric power from the IR lamp power source 64 stops and the irradiation of the IR light from the IR lamp 62 stops in response to a command signal from the control unit 40.

In the present example, by raising the temperature of the wafer 2 from −5° C. to 50° C. or higher between time t4 and time t5, particles of fluorine, etc. contained in the fluorocarbon layer CFx diffuse into the tungsten film through the boundary with the fluorocarbon layer and the intermediate layer containing tungsten and fluorine is generated between those film layers. The film thickness of the intermediate layer depends on the time of heating the wafer 2 by the IR lamp 62 at an early stage of forming the intermediate layer and increases as the time increases. After a predetermined time has elapsed, the amount of the formed intermediate layer reduces gradually and the thickness gradually approaches a predetermined value. In other words, the formation of the intermediate layer by heating has the characteristic of stopping in a self-limiting manner.

Here, although the wafer 2 is heated between time t4 and time t5 and the emission of the IR lamp 62 stops after the temperature has reached a temperature of 50° C. or higher at the step of heating the wafer 2, it is also possible to keep the temperature of the wafer 2 constant for a predetermined time by making adjustment of once increasing and then reducing the output of the IR lamp power source 64. Further, although the wafer 2 is heated in the state of being placed over the stage 4, it is also possible to heat the wafer 2 by being irradiated with the IR light in the state of maintaining the wafer 2 apart from the upper surface of the stage 4 by using a lift pin that is stored in the interior of the stage 4 and protrudes upward or retracts downward the tip from the upper surface of the stage 4. On this occasion, it is also possible to measure the temperature of the wafer 2 by using light that is emitted from the IR lamp 62, is transmitted through the wafer 2, and has reached a fiber 92-2 arranged in the interior of the stage 4. Further, it is desirable to control the power ratio of IR lamps 62-1, 62-2, and 62-3 on the basis of a temperature distribution in radial directions on a wafer plane.

Successively, at time t5, the Ar gas and the He gas the flow rates of which are adjusted by the operations of mass flow controllers 50-1 and 50-2 are supplied to the interior of the processing chamber 1 and the gap between the rear surface of the wafer 2 and the stage 4 respectively in response to a command signal from the control unit 40. By supplying the He gas, heat transfer between the wafer 2 and the stage 4 is promoted and the wafer 2 is cooled from the temperature T2 to T1=−5° C. Here, in the present example, the time required for the cooling is 20 seconds.

Successively, at time t6, a processing gas containing $O_2$ and Ar gases the flow rates of which are adjusted by the operations of the mass flow controllers 50-1 and 50-2 in multiple mass flow controllers 50 is supplied to the discharge region 3 in response to a command signal from the control unit 40. Further, the pressure regulating means 14 adjusts the opening of the flow channel of the vacuum exhaust pipe 16 and the pressure in the processing chamber 1 and the discharge region 3 in the interior of the quartz chamber 12 is adjusted to a value in a predetermined allowable range by the balance between the amount of the supplied processing gas containing oxygen and the amount of the exhaust gas from the vacuum exhaust pipe 16. In the state, at time t7, radio frequency power from the radio frequency power source 20 is supplied to the ICP coil 34 (state of 312) and plasma 10 using the processing gas containing oxygen is generated in the discharge region 3 in the interior of the quartz chamber 12 in response to a command signal from the control unit 40.

Although the magnitude of the radio frequency power outputted from the radio frequency power source 20 at time t7 is set at the same W2 as the output at time t2 in the present embodiment, a different value may also be adopted in accordance with processing conditions. Further, in the present example, electric power to operate the IR lamp 62 is not supplied even while the plasma 10 is generated in order to keep the temperature of the wafer 2 at T1=−5° C. which is equivalent to the temperature of the wafer 2 before the plasma 10 is generated.

In the state, at least some of the particles of the 02 gas and the Ar gas are excited, dissociated, or ionized by the plasma 10 and reactive particles including charged particles such as ions or an active species are formed. Further, a neutral gas and the reactive particles such as an active species formed in the discharge region 3 pass through a slit or through-holes formed in the slit plate 78, are introduced into the processing chamber 1, and are supplied to the surface of the wafer 2. The reactive particles including radicals of oxygen interact with the material of the fluorocarbon layer of the wafer 2, a volatile reaction product is generated, the reaction product is volatilized, detached from the surface of the wafer 2, and removed from the surface, and thus the etching treatment of the fluorocarbon layer shown at Step S606 in FIG. 6 progresses.

In the present example, by arranging the slit plate 78 in the gas flow channel 75, ions generated in the plasma 10 in the discharge region 3 are prevented from moving into the processing chamber 1 and hardly enter the surface of the wafer 2. As a result, except the fluorocarbon layer, interaction between the ions generated in the plasma 10 and the film structure over the wafer 2 reduces and etching of the tungsten film remaining as the base is inhibited from progressing.

Meanwhile, an amount of the removed fluorocarbon layer depends on the time of interaction between the reactive particles including oxygen radicals and the material of the surface of the layer and the temperature of the surface of the wafer 2 where the interaction occurs and increases as the time increases. In the present embodiment, the time during which the interaction occurs is a time equivalent to the time during which the plasma is formed in the discharge region 3 or an approximately equivalent time to the extent of being regarded as the time.

According to the studies by the present inventors, under the processing conditions including the temperature of the wafer 2 in the present modified example, if the time elapses for 10 seconds, almost the whole of the fluorocarbon layer formed at the step in the processing between time t2 and time t3 corresponding to Step S602 in FIG. 6 changes to the reaction product and is detached and removed from the surface of the film structure. Here, since the removal finishes when the fluorocarbon layer disappears, it can be said that the process of Step S606 from time t7 is self-limiting. That is, the etching of the fluorocarbon layer finishes in a self-limiting manner in 10 seconds or by time t8 after the radio frequency power starts to be supplied from the radio frequency power source 20 to the ICP coil 34 at time t7.

At time t8, the output of the radio frequency power from the radio frequency power source 20 to the ICP coil 34 stops, the supply of the processing gas containing an $O_2$ gas to the discharge region 3 stops, and the formation of the plasma 10 in the interior of the discharge region 3 stops in response to a command signal from the control unit 40. Further, the gas in the processing chamber 1 is exhausted to the exterior of the processing chamber 1 through the vacuum exhaust pipe 16 the opening of which is adjusted by the pressure regulating means 14 and through the exhaust means 15 in response to a command signal from the control unit 40.

Further, the supply of the He gas to the gap between the rear surface of the wafer 2 and the upper surface of the stage 4 stops, the direct current power that has been supplied from the DC power source 31 to the electrostatic attraction electrodes 30 stops, the electrostatic attraction force of the wafer 2 is released or reduced, a valve 52 opens, the He gas in the gap is exhausted to the exterior, and the pressure in the gap comes to be the same as the pressure in the processing chamber 1 or an approximate pressure to the extent of being regarded as the same. The above process corresponds to Step S607 in FIG. 6.

Further, at time t9, electric power is supplied at an output P1 from the IR lamp power source 64 to the IR lamp 62 and infrared is emitted from the IR lamp 62 to the wafer 2 in the processing chamber 1 in response to a command signal from the control unit 40. The IR light emitted from the IR lamp 62 is transmitted through the IR light transmission window 74, the wafer 2 is irradiated with the IR light and heated, and the temperature rises. In the present example, after the lapse of a predetermined time (25 seconds in the present example) from time t9, the temperature of the wafer 2 reaches a temperature of T3=150° C. or higher.

At t10 after the predetermined time has elapsed, the output of electric power from the IR lamp power source 64 stops and the irradiation of the IR light from the IR lamp 62 stops in response to a command signal from the control unit 40. The temperature of the wafer 2 rises from −5° C. to 150° C. or higher, thus the material of the intermediate layer is decomposed, and a volatile material such as WFx and WOxFy is generated. In the present example, during the heating of the wafer 2 between time t9 to time t10, almost the whole of the intermediate layer formed over the tungsten film changes to the volatile material, is volatilized or detached from the surface of the tungsten film of the wafer 2, and is removed from over the tungsten film. That is, the removal of the intermediate layer by heating has the characteristic of stopping in a self-limiting manner.

Here, in the heating process, although the irradiation of the IR lamp 62 stops after the temperature of the wafer 2 has reached 150° C. or higher, it is also possible to keep the temperature of the wafer 2 constant for a predetermined time by once increasing and then reducing the output of the IR lamp power source 64 by the control unit 40. Further, it is also possible to keep the wafer 2 apart above the upper surface of the wafer stage 4 by using a lift pin or the like and heat the wafer 2 by IR light. Furthermore, on this occasion, it is also possible to measure the temperature of the wafer 2 by using IR light that is emitted from the IR lamp 62, is transmitted through the wafer 2, and has reached a fiber 92-2 in the interior of the stage 4. Moreover, it is desirable to control the magnitudes or the ratios of the electric powers of the IR lamps 62-1, 62-2, and 62-3 on the basis of a temperature distribution in radial directions on a wafer plane Successively, at time t10, the Ar gas and the He gas the flow rates of which are adjusted by the operations of the mass flow controllers 50-1 and 50-2 are supplied to the interior of the processing chamber 1 and the gap between the rear surface of the wafer 2 and the stage 4 respectively in response to a command signal from the control unit 40. By supplying the He gas, heat transfer between the wafer 2 and the stage 4 is promoted and the wafer 2 is cooled from the temperature T3 to T1=−5° C. Here, in the present example, the time required for the cooling is 30 seconds. The above process corresponds to Step S608 in FIG. 6.

Further, at time t11 after time t10, as explained in FIG. 6, whether or not an etching amount or a remaining film thickness of the tungsten film over the wafer 2 reaches a desired value is judged (corresponding to Step S609) and a process of starting a next cycle or finishing the processing of the wafer 2 is implemented in response to the judgment result.

As stated above, etching treatment of one cycle including Steps S601 to S609 comprising the process of forming plasma 10 by using a processing gas containing $C_4F_8$ and Ar gases and forming a fluorocarbon layer over the upper surface of a wafer 2, the process of forming an intermediate layer by heating the wafer 2 with an IR lamp 62, the process of forming plasma by using a processing gas containing $O_2$ and Ar gases and removing the fluorocarbon layer, and the process of removing the intermediate layer by heating the wafer 2 with the IR lamp 62 finishes. The etching amount of a tungsten film per one cycle in the present example is 2 nm/cycle. For example, when an etching amount of 20 nm is necessary, the control unit 40 detects that an expected etching amount is obtained by repeating the above cycle ten times and then the etching treatment of the tungsten film of the wafer 2 finishes.

Figure 8:
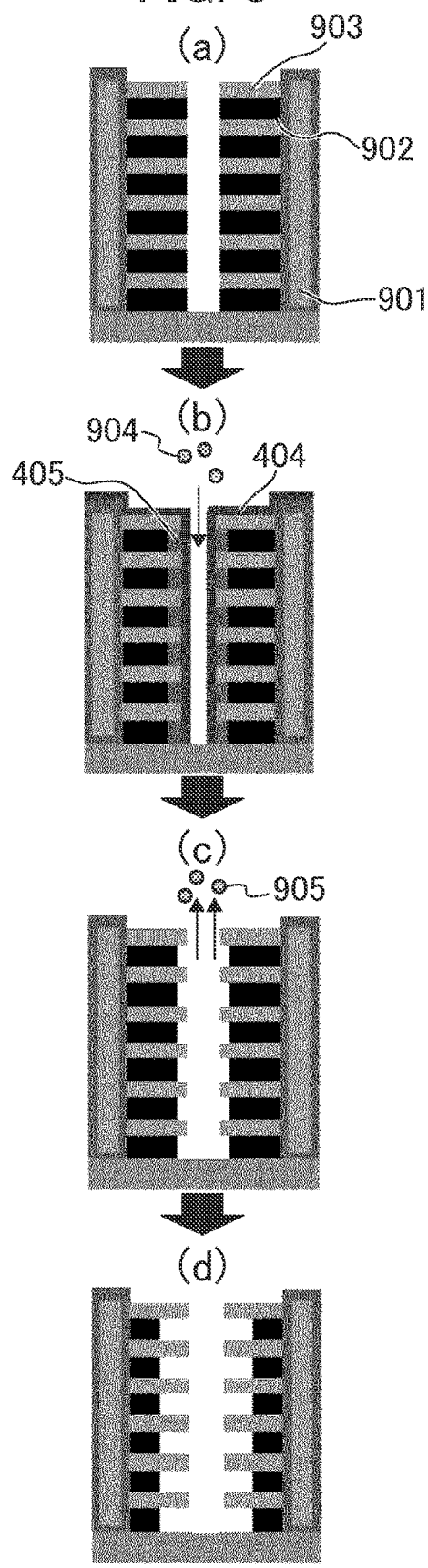
FIG. 8 is a longitudinal sectional view schematically showing the outline of change in a film structure including a film containing tungsten during processing of a wafer according to the embodiment shown in FIG. 1 and the modified example shown in FIG. 6.

FIG. 8 is a longitudinal sectional view schematically showing the outline of change in a film structure including a film containing tungsten during processing of a wafer according to the above embodiment and modified example. The film structure shown in the figure is the same as the film structure shown in FIG. 9. Further similarly, the film structure shows the processes through which only tungsten films 902 are laterally selectively etched relatively to silicon dioxide films 903 over the surface of the inner wall of a groove 911 that has a high aspect ratio and is formed by vertically passing through a laminated film formed by stacking the tungsten films 902 and the silicon dioxide films 903 alternately in a groove formed in a polycrystalline silicon film 901 arranged over a base film 911.

FIG. 8(*a*) shows the state of a film structure before etching treatment starts. FIG. 8(*b*) shows the film structure of the state of implementing Step S202 of the embodiment shown in FIG. 2 or Steps S602 to S604 of the modified example shown in FIG. 6 and FIG. 8(*c*) shows the film structure of the state of implementing Step S205 shown in FIG. 2 or Steps S606 to S608 shown in FIG. 6. FIG. 8(*d*) shows the film structure of the state of repeating the one cycle of the process shown in FIG. 2 or FIG. 6 multiple times.

As shown in FIG. 8(*c*), in the above embodiment and modified example, since the amounts (particularly thicknesses) of intermediate layers 405 formed over the surfaces of the tungsten films 902 are characterized so as to have self-limiting nature, variation of the etching amounts of the multiple tungsten films 902 in the depth direction of the groove 911 is inhibited and the etching amounts approach more uniform when one cycle of combining the fluorocarbon layer forming, the intermediate layer forming, the fluorocarbon layer removing, and the intermediate layer removing finishes. As a result, variation of the etching amounts in the depth direction of the groove 911 after the above cycle is repeated multiple times shown in FIG. 8(*d*) is also inhibited and a distribution of etching amounts approaching more uniform can be obtained. Here, in the modified example, the etching amount per one cycle can be adjusted appropriately by increasing or decreasing the length of processing time for heating the wafer 2 by using the IR lamp 62 that is implemented after the fluorocarbon layer 404 is formed in accordance with required processing dimensions.

Figure 10:
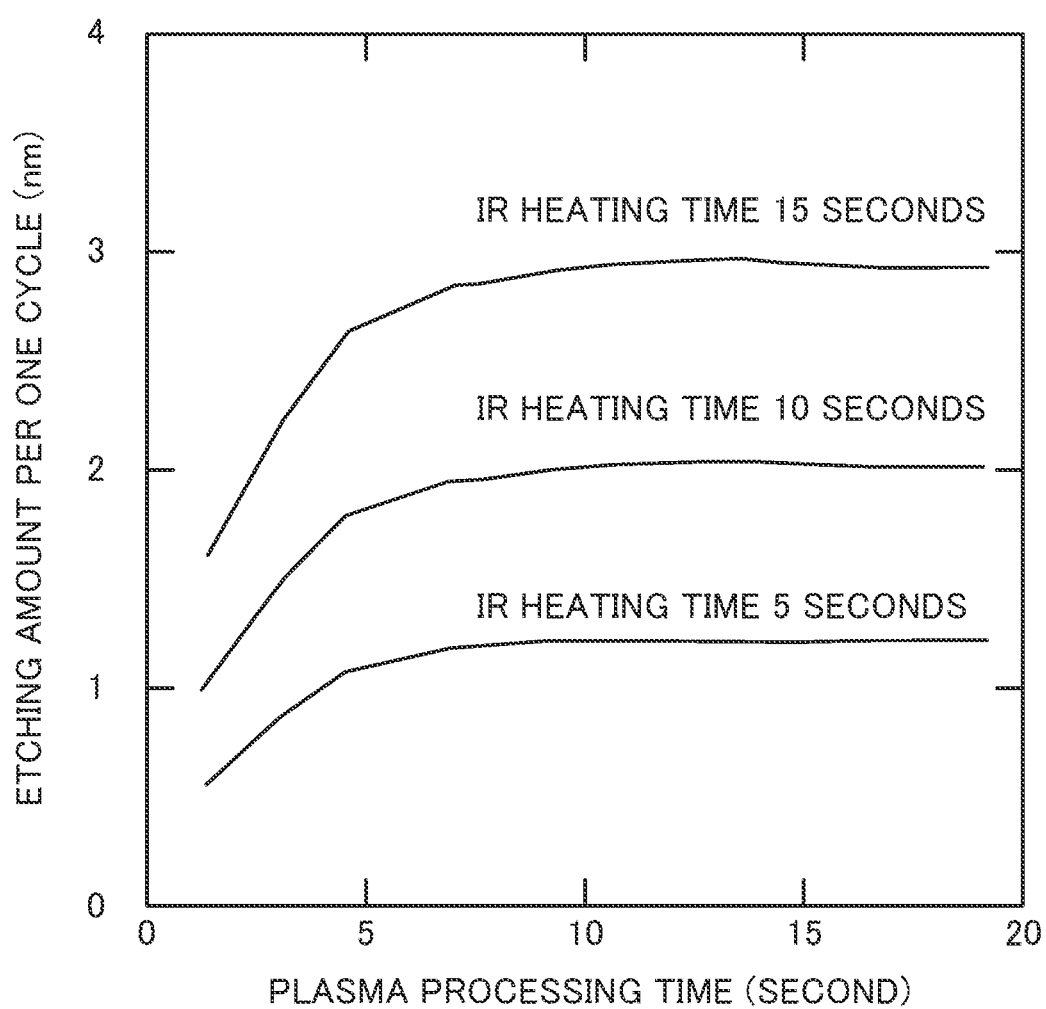
FIG. 10 is a graph showing change in an etching amount per one cycle in response to a length of processing time for forming a fluorocarbon layer during processing of a wafer according to the embodiment shown in FIG. 6.

FIG. 10 is a graph showing change in an etching amount per one cycle in response to a length of processing time for forming a fluorocarbon layer during processing of a wafer according to the embodiment shown in FIG. 6. Change in an etching amount responding to the change of processing time for forming a fluorocarbon layer for respective heating times by using the time for heating a wafer 2 with an IR lamp 62 that is implemented after the process of forming the fluorocarbon layer as a parameter is shown by solid lines.

As shown in the figure, it is obvious that, when the length of the processing time for forming a fluorocarbon layer is small, the etching amount per one cycle increases as the length of the processing time increases but, when the length of the processing time increases further, the etching amount reduces gradually, approaches a specific value gradually, and is self-limiting. Further, it is obvious that, when the time for heating the wafer 2 by the IR lamp 62, namely a heating amount or change of temperature, increases, the etching amount per one cycle increases. From the result shown in the figure, it is obvious that an etching amount per one cycle can be adjusted by increasing or decreasing the time for heating the wafer 2.

Further, although a gas containing $C_4F_8$ and Ar gases is used as the processing gas for forming a fluorocarbon layer in the above modified example, it is also possible to use another organic gas containing fluorine such as a gas containing $CH_2F_2$ or $CH_3F$ and Ar. Furthermore, the present invention is not limited to the above examples and includes various modified examples. The configuration shown in the above embodiment can be replaced with a configuration substantially identical, a configuration that exhibits the same action effect, or a configuration that can attain the same object.

For example, although the wafer 2 is heated by the IR lamp 62 after the fluorocarbon layer is formed in the above modified example, it is also possible to form the fluorocarbon layer and heat the wafer 2 by the IR lamp 62 simultaneously. Further, although the intermediate layer is removed by heating the wafer 2 with the IR lamp 62 after the process of removing the fluorocarbon layer in the above example, it is also possible to remove the fluorocarbon layer and remove the intermediate layer by heating the wafer 2 with the IR lamp 62 simultaneously.

Furthermore, although the IR lamp 62 is arranged at the exterior of the vacuum container above the processing chamber 1 on the outer circumference of the quartz chamber 12 surrounding the discharge region 3 in the plasma processing apparatus 100 in FIG. 1, it is also possible to arrange the IR lamp 62 in the interior of the quartz chamber 12 or the vacuum container. Moreover, the above example is explained in detail to make the present invention easier to understand and the present invention is not necessarily limited to the case of having all the explained configurations.

LIST OF REFERENCE SIGNS 1 processing chamber
2 wafer
3 discharge region
4 stage
5 shower plate
6 top board
10 plasma
11 base chamber
12 quartz chamber
14 pressure regulating means
15 exhaust means
16 vacuum exhaust pipe
17 gas dispersion plate
20 radio frequency power source
22 matching device
25 radio frequency cut filter
30 electrostatic attraction electrode
31 DC power source
34 ICP coil
38 chiller
39 flow channel of refrigerant
40 control unit
41 arithmetic unit
50 mass flow controller
51 mass flow control unit
52, 53, 54 valve
60 container
62 IR lamp
63 reflective plate
64 IR lamp power source
70 thermocouple
71 thermocouple thermometer
74 light transmission window
75 gas flow channel
78 slit plate
81 O-ring
92 optical fiber
93 external IR light source
94 optical path switch
95 light distributor
96 spectroscope
97 detector
98 optical multiplexer
100 plasma processing apparatus
200 gas supply flow rate
210 discharge power
220 IR lamp power
230 electrostatic attraction and rear surface He pressure
240 wafer temperature
401 silicon substrate
402 tungsten film
403 active species
404 fluorocarbon layer
405 intermediate layer
406 reaction product

The invention claimed is:

1. A plasma processing method comprising:
a first processing step of arranging a wafer to be processed in a processing chamber, supplying plasma of an organic gas containing fluorine into the processing chamber, depositing a fluorocarbon layer over the upper surface of a film layer to be processed that is formed over the upper surface of the wafer beforehand and contains tungsten, and forming an intermediate layer that contains tungsten and fluorine in the film layer to be processed and is self-limiting between the fluorocarbon layer and the film layer to be processed; and
a second processing step of supplying particles in plasma formed in the processing chamber by using a gas containing oxygen to the upper surface of the film layer to be processed and removing the fluorocarbon layer and the intermediate layer.

2. The plasma processing method according to claim 1, wherein:
the first step includes, after depositing the fluorocarbon layer, a step of heating the upper surface of the wafer and forming the intermediate layer having the self-limiting nature; and
the second step includes, after supplying the particles in the plasma using the gas containing oxygen and removing the fluorocarbon layer, a step of heating the wafer and removing the intermediate layer.

3. The plasma processing method according to claim 2, wherein the wafer is heated by irradiating the upper surface of the wafer with infrared at the first or second step.

4. The plasma processing method according to claim 2, wherein multiple steps including the step of removing the fluorocarbon layer and the step of removing the intermediate layer by heating the wafer in the second step are regarded as one cycle and the cycle is repeated multiple times.

* * * * *